US011889700B2

(12) United States Patent
Lee et al.

(10) Patent No.: US 11,889,700 B2
(45) Date of Patent: Jan. 30, 2024

(54) SEMICONDUCTOR DEVICE INCLUDING DUMMY CHANNELS AND THROUGH WIRING STRUCTURE

(71) Applicant: Samsung Electronics Co., Ltd., Suwon-si (KR)

(72) Inventors: Sooyong Lee, Yongin-si (KR); Seorim Moon, Seoul (KR); Bongsoo Kang, Seoul (KR); Kyungjae Park, Hwaseong-si (KR); Cheol Ryou, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 17/220,340

(22) Filed: Apr. 1, 2021

(65) Prior Publication Data

US 2021/0399005 A1    Dec. 23, 2021

(30) Foreign Application Priority Data

Jun. 23, 2020   (KR) .................. 10-2020-0076385

(51) Int. Cl.
*H10B 43/50*     (2023.01)
*H01L 23/535*    (2006.01)
(Continued)

(52) U.S. Cl.
CPC ....... *H10B 43/50* (2023.02); *H01L 21/76805* (2013.01); *H01L 21/76895* (2013.01);
(Continued)

(58) Field of Classification Search
CPC ........ H10B 43/40; H10B 43/27; H10B 41/50; H10B 41/41; H10B 41/27; H10B 43/50;
(Continued)

(56) References Cited

U.S. PATENT DOCUMENTS 9,076,879 B2    7/2015  Yoo et al.
9,601,502 B2    3/2017  Sano et al.
(Continued)

FOREIGN PATENT DOCUMENTS

KR    1020180100367 A     9/2018
KR     20210016214 A  *  2/2021   ........ H01L 27/11582

*Primary Examiner* — Mark W Tornow
*Assistant Examiner* — David Paul Sedorook
(74) *Attorney, Agent, or Firm* — Myers Bigel, P.A.

(57) ABSTRACT

A semiconductor device includes a peripheral circuit region including a first substrate and circuit devices on the first substrate, a memory cell region including a second substrate on the first substrate, a horizontal conductive layer on the second substrate, gate electrodes stacked on the horizontal conductive layer in a first direction perpendicular to an upper surface of the second substrate and spaced apart from each other, and channel structures extending in gate electrodes in the first direction, each of the channel structures including a channel layer in physical contact with the horizontal conductive layer, and a through wiring region including a through contact plug extending in the first direction and electrically connecting the memory cell region to the peripheral circuit region, an insulating region bordering the through contact plug, and dummy channel structures partially extending into the insulating region in the first direction.

18 Claims, 20 Drawing Sheets

(51) Int. Cl.
*H01L 21/768* (2006.01)
*H10B 41/27* (2023.01)
*H10B 41/41* (2023.01)
*H10B 41/50* (2023.01)
*H10B 43/27* (2023.01)
*H10B 43/40* (2023.01)

(52) U.S. Cl.
CPC ........... *H01L 23/535* (2013.01); *H10B 41/27* (2023.02); *H10B 41/41* (2023.02); *H10B 41/50* (2023.02); *H10B 43/27* (2023.02); *H10B 43/40* (2023.02)

(58) Field of Classification Search
CPC ............ H10B 43/35; H10B 41/35; H01L 2225/06541; H01L 21/76877; H01L 21/76898; H01L 23/481; H01L 23/5226
See application file for complete search history.

(56) References Cited

U.S. PATENT DOCUMENTS

| | | | |
|---|---|---|---|
| 9,627,403 B2 | 4/2017 | Liu et al. | |
| 10,381,322 B1 | 8/2019 | Azuma et al. | |
| 10,411,028 B2 | 9/2019 | Arisumi et al. | |
| 10,438,904 B2 | 10/2019 | Ito et al. | |
| 10,446,573 B2 | 10/2019 | Liao | |
| 2017/0352680 A1* | 12/2017 | Shin | H01L 23/535 |
| 2018/0122819 A1* | 5/2018 | Shim | H10B 43/50 |
| 2018/0358374 A1* | 12/2018 | Kim | H01L 23/5283 |
| 2019/0067314 A1 | 2/2019 | Lu et al. | |
| 2019/0067321 A1* | 2/2019 | Song | H10B 43/35 |
| 2019/0319038 A1* | 10/2019 | Zhang | H01L 23/535 |
| 2020/0144285 A1* | 5/2020 | Lee | H10B 43/35 |
| 2020/0212058 A1* | 7/2020 | Wei | H10B 43/27 |
| 2020/0350326 A1* | 11/2020 | Yun | H10B 41/10 |
| 2021/0013304 A1* | 1/2021 | Ryu | H10B 43/50 |
| 2021/0057444 A1* | 2/2021 | Park | H10B 41/27 |

* cited by examiner

SEMICONDUCTOR DEVICE INCLUDING DUMMY CHANNELS AND THROUGH WIRING STRUCTURE

CROSS-REFERENCE TO RELATED APPLICATION

This application claims benefit of priority to Korean Patent Application No. 10-2020-0076385 filed on Jun. 23, 2020 in the Korean Intellectual Property Office, the disclosure of which is incorporated herein by reference in its entirety.

BACKGROUND

Example embodiments of the inventive concept relate to a semiconductor device.

As demand for high performance, high speed, and/or multifunctionality in a semiconductor device has increased, integration density of a semiconductor device has also increased. With the trend of high integration density in semiconductor devices, it may be important to uniformly form fine patterns included in a semiconductor device throughout an entire region of the semiconductor device.

SUMMARY

An example embodiment of the inventive concept may provide a semiconductor device having improved reliability.

According to an example embodiment of the inventive concept, a semiconductor device includes a peripheral circuit region including a first substrate and circuit devices on the first substrate, a memory cell region including a second substrate on the first substrate, gate electrodes stacked in a first direction perpendicular to an upper surface of the second substrate and spaced apart from each other, and channel structures extending in the gate electrodes in the first direction, each of the channel layers including a channel layer, and a through wiring region adjacent to the channel structures, and electrically connecting the peripheral circuit region to the memory cell region, wherein the through wiring region includes an insulating region side by side with the second substrate and the gate electrodes, a through contact plug extending through the insulating region in the first direction, and dummy channel structures partially extending into an upper portion of the insulating region, each of the dummy channel structures including the channel layer, wherein each of the channel structures has a first height in the first direction, and each of the dummy channel structures has a second height smaller than the first height, and wherein the channel structures are arranged with a first pitch in a second direction perpendicular to the first direction, and the dummy channel structures are arranged with a second pitch different from the first pitch in the second direction in a region adjacent to at least one of the channel structures.

According to an example embodiment of the inventive concept, a semiconductor device includes a peripheral circuit region including a first substrate and circuit devices on the first substrate, a memory cell region including a second substrate on the first substrate, a horizontal conductive layer on the second substrate, gate electrodes stacked on the horizontal conductive layer in a first direction perpendicular to an upper surface of the second substrate and spaced apart from each other, and channel structures extending in the gate electrodes in the first direction, each of the channel structures including a channel layer in physical contact with the horizontal conductive layer, and a through wiring region including a through contact plug extending in the first direction and electrically connecting the memory cell region to the peripheral circuit region, an insulating region bordering the through contact plug, and dummy channel structures partially extending into the insulating region, in the first direction, each of the dummy channel structures including the channel layer and being spaced apart from the horizontal conductive layer in the first direction.

According to an example embodiment of the inventive concept, a semiconductor device includes a substrate, gate electrodes stacked on the substrate and spaced apart from each other, channel structures extending in the gate electrodes in a first direction perpendicular to an upper surface of the substrate, each of the channel structures including a channel layer, an insulating region side by side with the gate electrodes in a second direction perpendicular to the first direction, and dummy channel structures extending into the insulating region in the first direction, each of the dummy channel structures including the channel layer, wherein each of the dummy channel structures has a first region in an upper portion of the insulating region along the first direction and includes the channel layer, and a second region, which includes a lower end along the first direction and does not include the channel layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
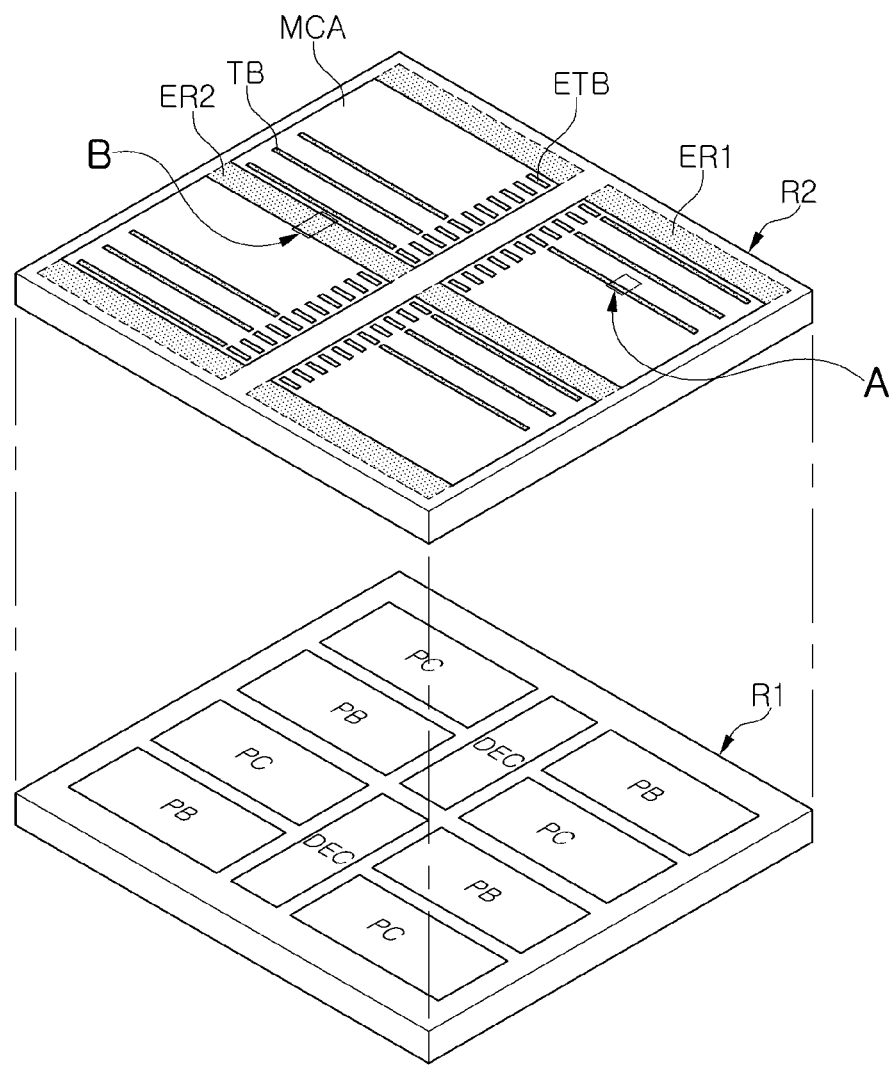
FIG. 1 is a schematic layout view illustrating a semiconductor device according to an example embodiment of the present inventive concept.

Hereinafter, embodiments of the present disclosure will be described as follows with reference to the accompanying drawings in which example embodiments of the inventive concept are shown. The same reference numerals are used for the same elements in the drawings, and redundant descriptions thereof will be omitted. As used herein, the term "and/or" includes any and all combinations done or more of the associated listed items. It will be understood that when an element is referred to as being "on," "attached" to, "connected" to, "coupled" with, "contacting," etc., another element, it can be directly on, attached to, connected to, coupled with or contacting the other element or intervening elements may also be present. In contrast, when an element is referred to as being, for example, "directly on," "directly attached" to, "directly connected" to, "directly coupled" with or "directly contacting" another element, there are no intervening elements present. It is noted that aspects described with respect to one embodiment may be incorporated in different embodiments although not specifically described relative thereto. That is, all embodiments and/or features of any embodiments can be combined in any way and/or combination.

FIG. 1 is a schematic layout view illustrating a semiconductor device according to an example embodiment.

Referring to FIG. 1, a semiconductor device 10 may include first and second regions R1 and R2 stacked in a vertical direction. The first region R1 may be configured as a peripheral circuit region and may include a row decoder DEC, a page buffer PB, and another peripheral circuit PC. The second region R2 may be configured as a memory cell region and may include memory cell arrays MCA and first and second through wiring regions TB and ETB.

In the first region R1, the row decoder DEC may, by decoding an input address, generate and transmit driving signals for a word line. The page buffer PB may be connected to the memory cell arrays MCA through bit lines, and may read data stored in the memory cells. The other peripheral circuit PC may include a control logic and a voltage generator, and may include, for example, a latch circuit, a cache circuit, and/or a sense amplifier. The first region R1 may further include a pad region, and in some embodiments, the pad region may include an electrostatic discharge (ESD) device or a data input and output circuit.

At least a portion of the various circuit regions DEC, PB, and PC in the first region R1 may be disposed below the memory cell arrays MCA disposed in the second region R2 as shown in FIG. 1. For example, the page buffer PB and/or the other peripheral circuits PC may be disposed below the memory cell arrays MCA and may overlap the memory cell arrays MCA. In example embodiments, circuits included in the first region R1 and the arrangement form thereof may be varied, and accordingly, circuits overlapping the memory cell arrays MCA may also be varied.

In the second region R2, the memory cell arrays MCA may be spaced apart from each other. Four memory cell arrays MCA are disposed in FIG. 1, but the number and the arrangement form of the memory cell arrays MCA disposed in the second region R2 may be varied in example embodiments.

The first and second through wiring regions TB and ETB may include a wiring structure that penetrates or extends into the second region R2 and is connected to the first region R1. The first through wiring regions TB may be disposed in the memory cell arrays MCA with a predetermined gap, and may include, for example, a wiring structure electrically connected to the page buffer PB disposed in the first region R1. The second through wiring regions ETB may be disposed in at least one edge region of the memory cell arrays MCA, and may include, for example, a wiring structure such as a contact plug electrically connected to the row decoder DEC disposed in the first region R1. The second through wiring regions ETB may be disposed in a greater number than the number of the first through wiring regions TB, and the shape, the number, and the arrangement position of each of the first and second through wiring regions TB and ETB may be varied in example embodiments.

In the second region R2, first and second edge regions ER1 and ER2 may be disposed on an external side of the memory cell arrays MCA and between the memory cell arrays MCA, respectively. A wiring structure penetrating or extending into the second region R2 and connected to the first region R1 may be disposed in the first and second edge regions ER1 and ER2, similar to the first and second through wiring regions TB and ETB.

Figure 2A:
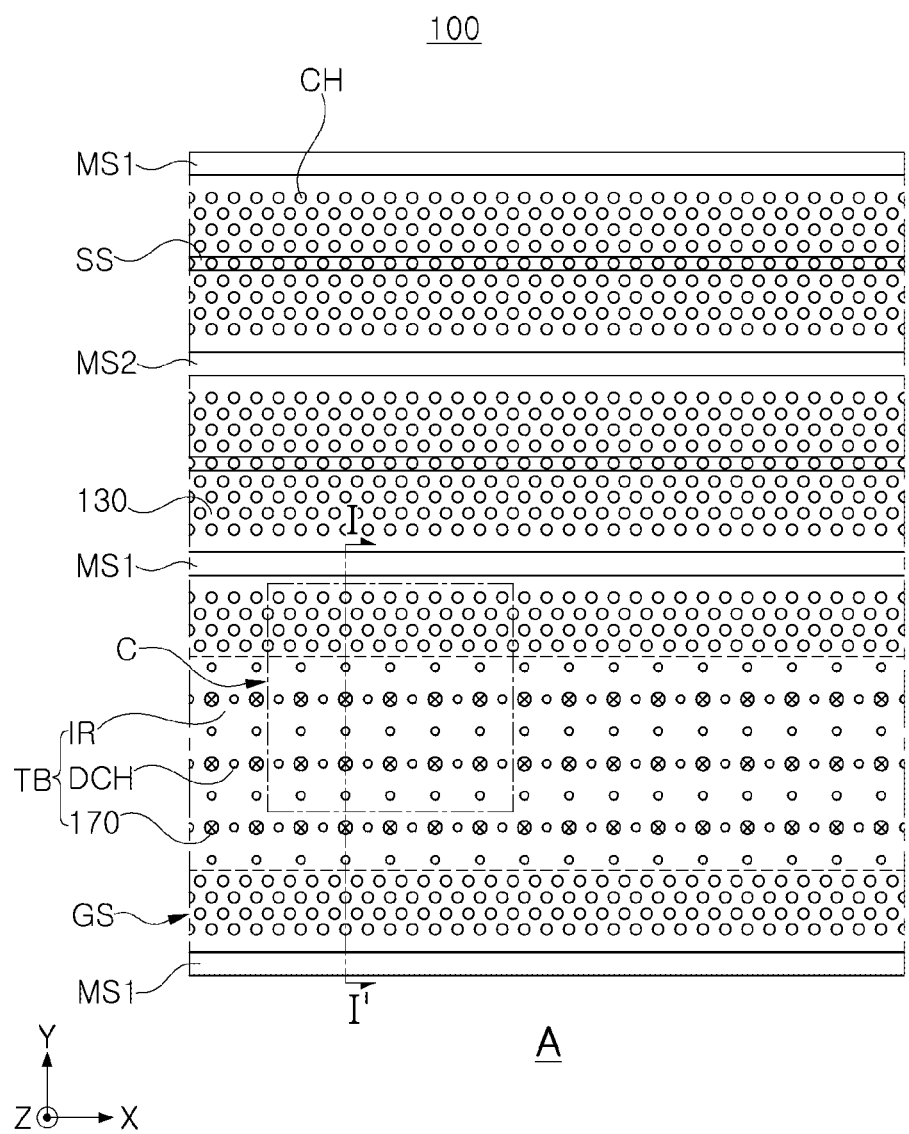
FIGS. 2A and 2B are plan views illustrating a semiconductor device according to an example embodiment of the present inventive concept.
Figure 2B:
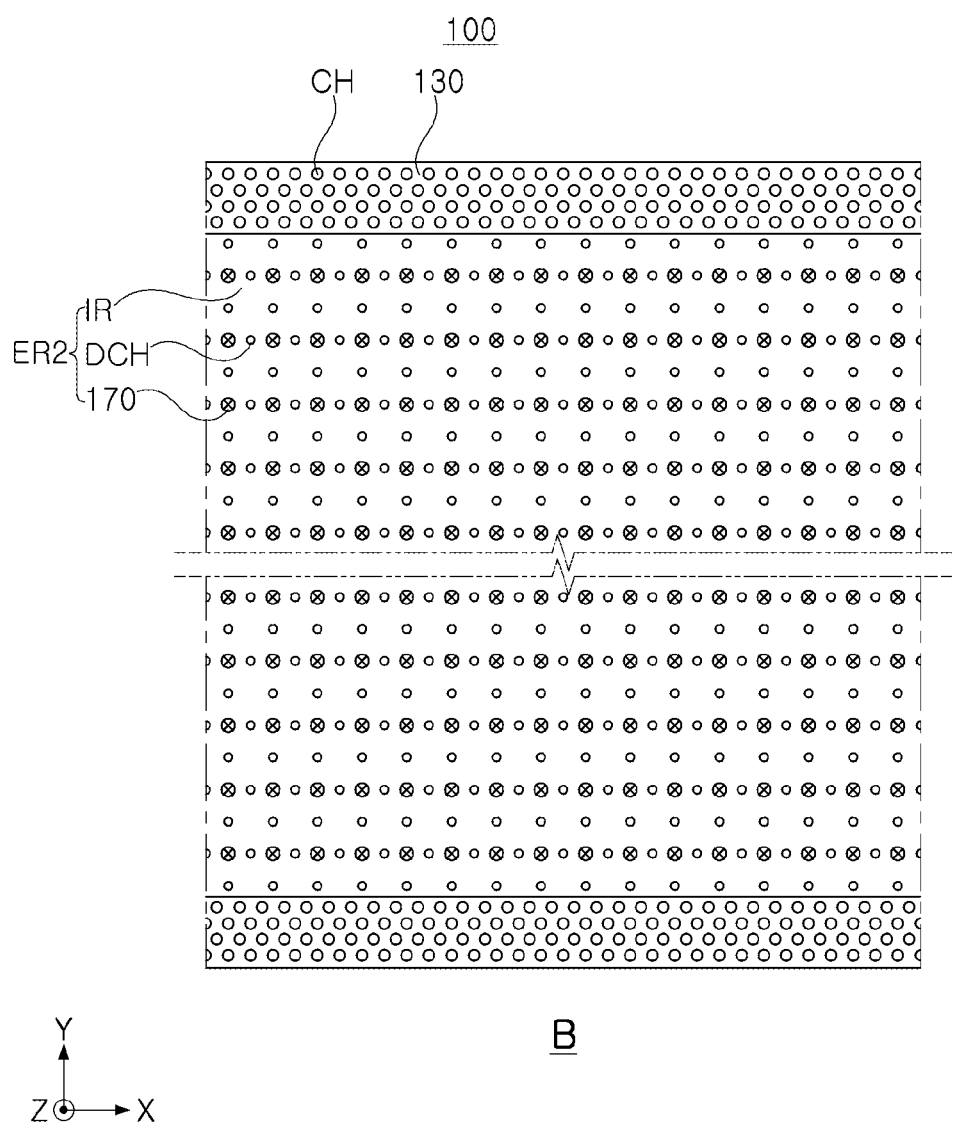

FIGS. 2A and 2B are plan views illustrating a semiconductor device according to an example embodiment. FIG. 2A is a plan view illustrating region "A" in FIG. 1, and FIG. 2B is a plan view illustrating region "B" in FIG. 1.

Figure 3:
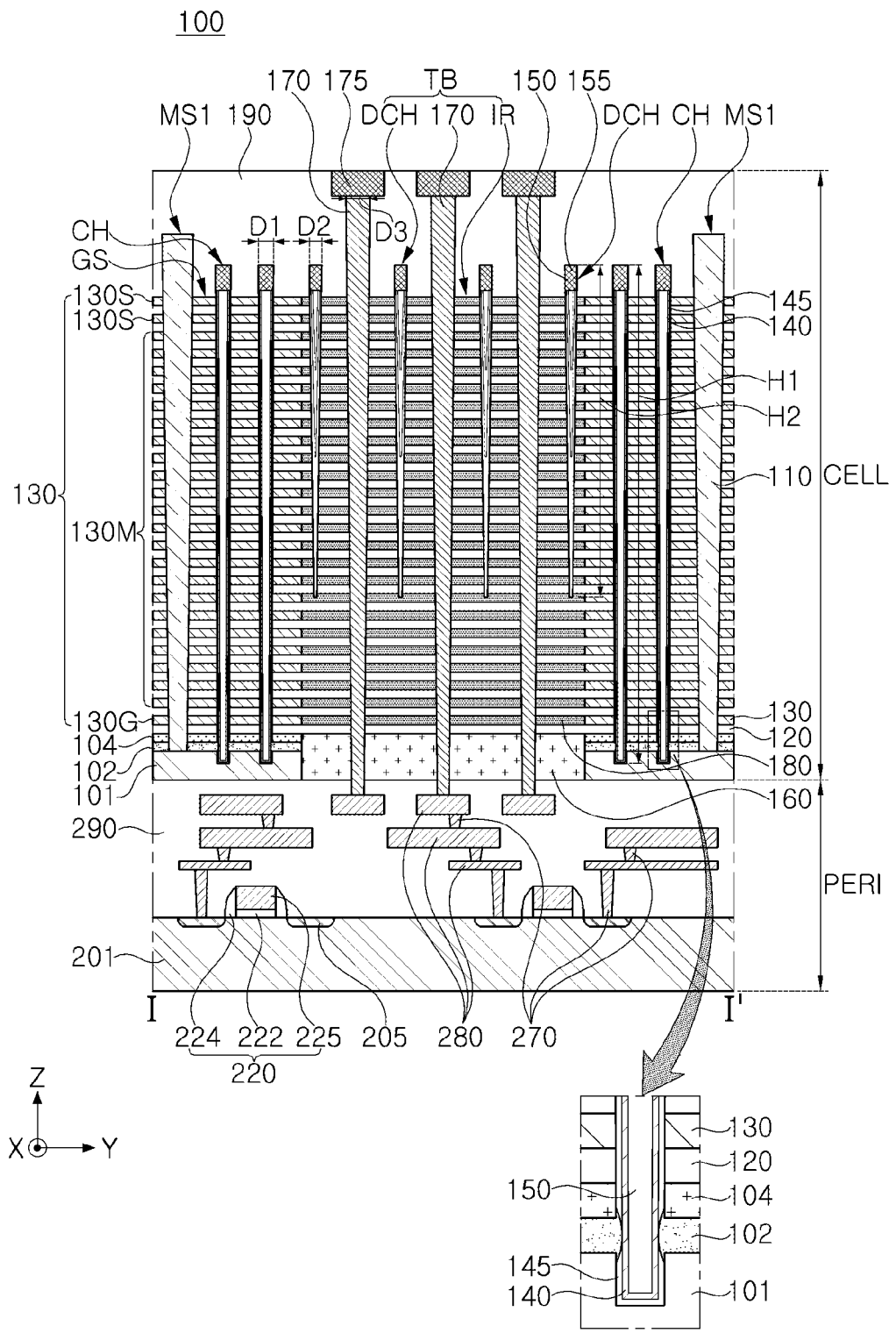
FIG. 3 is a schematic cross-sectional view illustrating a semiconductor device according to an example embodiment of the present inventive concept.

FIG. 3 is a schematic cross-sectional view illustrating a semiconductor device according to an example embodiment. FIG. 3 illustrates a cross-sectional surface along line I-I' in FIG. 2A.

Referring to FIGS. 2A, 2B, and 3, a semiconductor device 100 may include a memory cell region CELL, a peripheral circuit region PERI, and a through wiring region TB. The memory cell region CELL may be disposed above the peripheral circuit region PERI in the z direction as shown in FIG. 3, and the through wiring region TB may connect the memory cell region CELL to the peripheral circuit region PERI. In other example embodiments, the cell region CELL may be disposed below the peripheral circuit region PERI in the z direction, in contrast to the above-described configuration.

The memory cell region CELL may include a substrate 101, first and second horizontal conductive layers 102 and 104 on the substrate 101, gate electrodes 130 stacked on the substrate 101, first and second separation regions MS1 and MS2 extending through a stack structure GS of the gate electrodes 130, upper separation regions SS partially penetrating or extending into the stack structure GS, and channel structures CH penetrating or extending into the stack structure GS. The memory cell region CELL may further include interlayer insulating layers 120 alternately stacked with the gate electrodes 130 on the substrate 101, wiring lines 175, and a cell region insulating layers 190.

The substrate 101 may have an upper surface extending in the x direction and the y direction. The substrate 101 may include a semiconductor material, such as a group IV semiconductor, a group III-V compound semiconductor, or a group II-VI compound semiconductor. For example, the group IV semiconductor may include silicon, germanium, or silicon-germanium. The substrate 101 may be provided as a bulk wafer or an epitaxial layer.

The first and second horizontal conductive layers 102 and 104 may be stacked on the upper surface of the substrate 101. At least a portion of the first and second horizontal conductive layers 102 and 104 may function as a portion of a common source line of the semiconductor device 100, and may function as a common source line along with the substrate 101, for example. As shown in the enlarged view in FIG. 3, the first horizontal conductive layer 102 may be directly connected to the channel layer 140 on a circumference of the channel layer 140. The first and second horizontal conductive layers 102 and 104 may include a semiconductor material, such as polycrystalline silicon, for example. In such embodiments, at least the first horizontal conductive layer 102 may be a doped layer, and the second horizontal conductive layer 104 may be a doped layer or a layer including impurities diffused from the first horizontal conductive layer 102. In example embodiments, the second horizontal conductive layer 104 may be replaced with a horizontal insulating layer.

The first and second horizontal conductive layers 102 and 104 may not extend into the through wiring region TB. Accordingly, one ends of the first and second horizontal conductive layers 102 and 104 may be disposed adjacent to the through wiring region TB. For example, the one ends of the first and second horizontal conductive layers 102 and 104 may be in physical contact with the substrate insulating layer 160.

The gate electrodes 130 may be vertically stacked on a substrate 101, may be spaced apart from each other, and may form the stack structure GS. The gate electrodes 130 may include a lower gate electrode 130G forming a gate of a ground select transistor, memory gate electrodes 130M forming a plurality of memory cells, and upper gate electrodes 130S forming gates of string select transistors. The number of memory gate electrodes 130M forming the memory cells may be determined according to the capacity of the semiconductor device 100. In example embodiments, the number of each of the upper and lower gate electrodes 130S and 130G may be one or two or more, respectively, and the upper and lower gate electrodes 130S and 130G may have a structure the same as or different from that of the memory gate electrodes 130M. In example embodiments, the gate electrodes 130 may Further include a gate electrode 130 disposed above the upper gate electrodes 130S and/or below the lower gate electrodes 130G in the cross-sectional view of FIG. 3 and forming an erase transistor for performing an erase operation using a gate induced drain leakage (GIDL) phenomenon. Also, a portion of the gate electrodes 130, the memory gate electrodes 130M adjacent to the upper or lower gate electrodes 130S and 130G, for example, may be configured as dummy gate electrodes.

Figure 9:
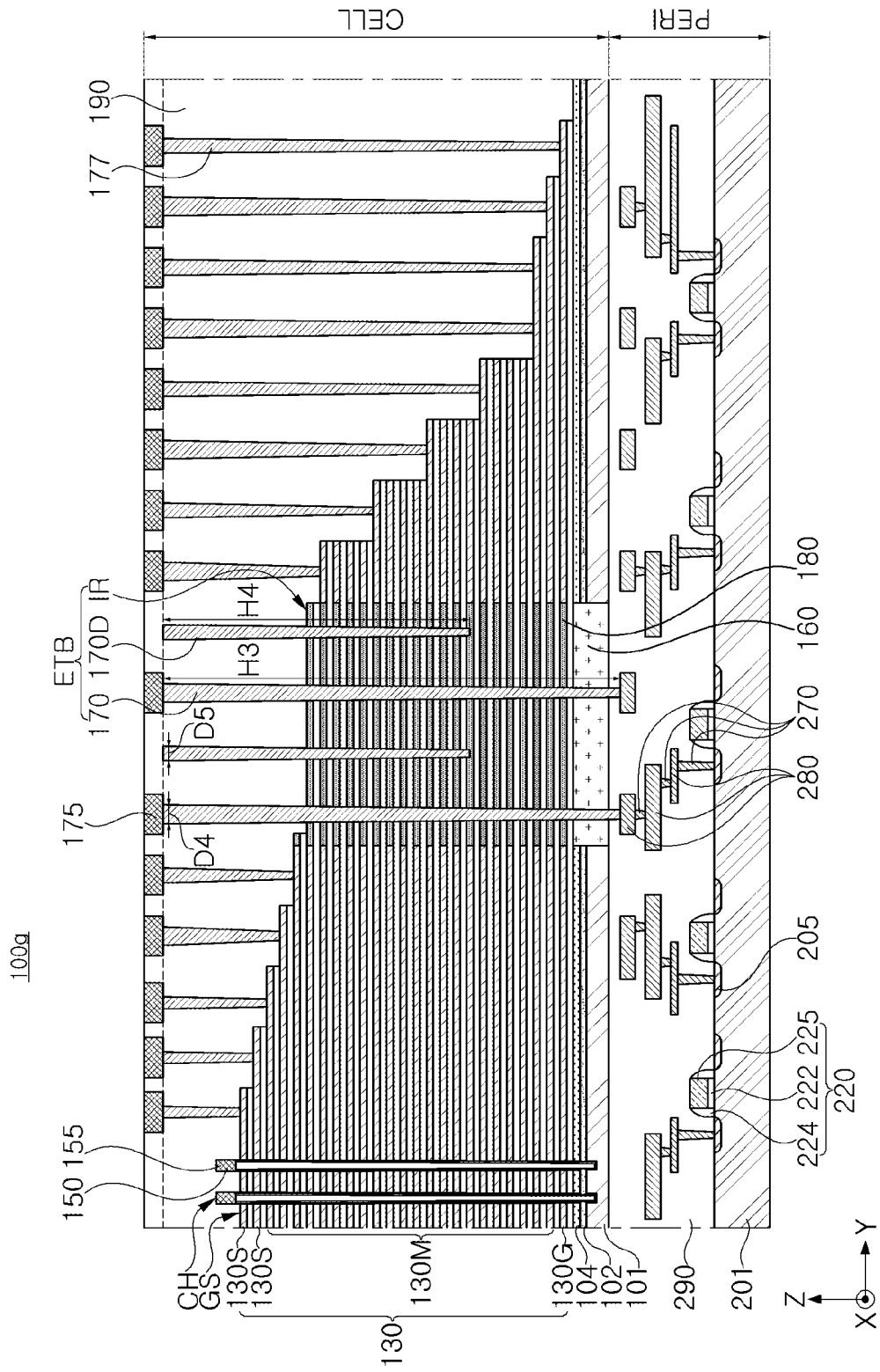
FIG. 9 is a cross-sectional view illustrating a semiconductor device according to an example embodiment of the present inventive concept.

Gate electrodes 130 may be stacked vertically and spaced apart from each other in a central region as shown in FIG. 3. As shown in FIG. 9, the gate electrodes 130 may extend by different lengths in an end region along at least one direction and may form stepped portions in a staircase shape. Due to the stepped portions, in the gate electrodes 130, the lower gate electrode 130 may extend farther than the upper gate electrode 130 such that pad regions exposed to an upper portion may be provided. The gate electrodes 130 may be connected to contact plugs in the pad regions and may be connected to the upper wiring lines 175.

As shown in FIG. 2A, the gate electrodes 130 may be isolated from each other in the y direction by a first separation region MS1 extending in the x direction, The gate electrodes 130 between a pair of the first separation regions MS1 may form a single memory block, but a range of the memory block is not limited thereto. A portion of the gate electrodes 130, the memory gate electrodes 130M, for example, may form a respective single layer in a single memory block.

The gate electrodes 130 may include a metal material, such as tungsten (W), for example. In example embodiments, the gate electrodes 130 may include polycrystalline silicon or a metal silicide material. In example embodiments, the gate electrodes 130 may further include a diffusion barrier. For example, the diffusion barrier may include tungsten nitride (WN), tantalum nitride (TaN) and titanium nitride (TiN) or a combination thereof.

Interlayer insulating layers 120 may be disposed between the gate electrodes 130. Similar to the gate electrodes 130, the interlayer insulating layers 120 may be spaced apart from each other in a direction perpendicular to the upper surface of the substrate 101 and may extend in the x direction. The interlayer insulating layers 120 may include an insulating material, such as silicon oxide or silicon nitride.

The first and second separation regions MS1 and MS2 may penetrate or extend into the gate electrodes 130 and may extend in the x direction. The first and second separation regions MS1 and MS2 may be disposed in parallel to each other. The first and second separation regions MS1 and MS2 may penetrate or extend into the entire gate electrodes 130 stacked on the substrate 101 to extend therethrough and may be connected to the substrate 101. The first separation regions MS1 may extend in the x direction as a single region, and the second separation regions MS2 may intermittently extend or may be only disposed in a partial region. Also, the first and second separation regions MS1 and MS2 may not overlap the through wiring regions TB and may be spaced apart from the through wiring regions TB. In example embodiments, the arrangement order and the number of each of the first and second separation regions MS1 and MS2 are not limited to the examples shown in FIG. 2A.

As shown in FIG. 3, a separation insulating layer 110 may be disposed in the first and second separation regions MS1 and MS2. The separation insulating layer 110 may have a shape in which a width thereof decreases toward the substrate 101 due to a high aspect ratio, but example embodiments thereof are not limited thereto. The separation insulating layer 110 may have a side surface perpendicular to the upper surface of the substrate 101. In example embodiments, a conductive layer may be further disposed between the separation insulating layers 110 in the first and second separation regions MS1 and MS2. In such embodiments, the conductive layer may function as a common source line of the semiconductor device 100 or a contact plug connected to the common source line.

The upper separation regions SS may extend in the x direction between the first separation regions MS1 and the second separation regions MS2 as shown in FIG. 2A. The upper separation regions SS may be disposed in a region in which the through wiring region TB is not disposed. The upper separation regions SS may partially penetrate or extend into the gate electrodes 130 including the uppermost gate electrodes 130S of the gate electrodes 130. The upper separation regions SS may isolate three gate electrodes 130 including the upper gate electrodes 130S from one another in the y direction. The number of the gate electrodes 130 isolated by the upper separation regions SS may be varied in example embodiments. The upper gate electrodes 130S isolated from one another by the upper separation regions SS may form different string select lines. The upper separation regions SS may include an insulating layer.

Each of the channel structures CH may form a single memory cell string, and may be spaced apart from each other while forming rows and columns. The channel structures CH may be disposed to form a lattice pattern or may be disposed in a zigzag shape in one direction. Each of the channel structures CH may have a columnar shape, and may have an inclined side surface of which a width decreases towards the substrate 101 based on an aspect ratio. In example embodiments, the channel structures CH adjacent to the through wiring region TB may be dummy channels, which may not substantially constitute a memory cell string.

As shown in the enlarged view in FIG. 3, the channel layer 140 may be disposed in the channel structures CH. In the channel structures CH, the channel layer 140 may be formed in an annular shape bordering or at least partially surrounding the channel filling insulating layer 150 disposed therein, but in example embodiments, the channel layer 140 may have a columnar shape such as a cylindrical shape or a prism shape without the channel filling insulating layer 150. The channel layer 140 may be connected to the first horizontal conductive layer 102 on a lower portion. The channel layer 140 may include a semiconductor material, such as polycrystalline silicon or single crystalline silicon.

Channel pads 155 may be disposed on the channel layer 140 in the channel structures CH. The channel pads 155 may at least partially cover an upper surface of the channel filling insulating layer 150 and may be electrically connected to the channel layer 140. The channel pads 155 may include doped polycrystalline silicon, for example. The channel structures CH disposed linearly in the y direction between the first or second separation regions MS1 and MS2 and the upper separation region SS may be electrically separated from each other by an upper wiring structure connected to the channel pads 155.

The gate dielectric layer 145 may be disposed between the gate electrodes 130 and the channel layer 140. Although not specifically indicated in the view, the gate dielectric layer 145 may include a tunneling layer, a charge storage layer, and a blocking layer stacked in order from the channel layer 140. The tunneling layer may tunnel an electric charge to the charge storage layer, and may include silicon oxide ($SiO_2$), silicon nitride ($Si_3N_4$), silicon oxynitride (SiON) or a combination thereof, for example. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The through wiring region TB may correspond to the first through wiring region TB in FIG. 1, and may include a wiring structure for electrically connecting the memory cell region CELL to the peripheral circuit region PERI. Also, the through wiring region TB may be disposed between regions in which the channel structures CH are disposed. The through wiring region TB may include through contact plugs 170 penetrating or extending into the stack structure GS of the gate electrodes 130 and the substrate 101 and extending in the z direction, an insulating region IR bordering or at least partially surrounding the through contact plugs 170, and dummy channel structures DCH at least partially penetrating or extending into the insulating region IR. A single through wiring region TB may be disposed in each of the plurality of memory blocks, for example. The number, a size, the arrangement form, and a shape of the through wiring region TB may be varied in example embodiments.

The through wiring region TB may be spaced apart from the first and second separation regions MS1 and MS2 as shown in FIG. 2A. For example, the through wiring region TB may be spaced apart from the first separation regions MS1 adjacent to each other in the y direction and may be disposed in a central region of the adjacent first separation regions MS1. Accordingly, an insulating region IR of the through wiring region TB may be formed. This configuration will be described in greater detail with reference to FIG. 11D.

The insulating region IR may penetrate or extend into the memory cell region CELL and may be disposed side by side with the substrate 101 and the gate electrodes 130. The gate electrode 130 may not be disposed in the insulating region IR or may not extend thereto, and the insulating region IR may be formed of an insulating material. The insulating region IR may include a substrate insulating layer 160, which is a first insulating layer disposed side by side with the substrate 101 on a same level as the substrate 101, and interlayer insulating layers 120 and sacrificial insulating layers 180, which are second and third insulating layers alternately stacked on the upper surface of the substrate 101.

The substrate insulating layer 160 may be disposed in a region from which the substrate 101 is partially removed, and may be bordered by or at least partially surrounded by the substrate 101. The substrate insulating layer 160 may have an upper surface substantially coplanar with an upper surface of the second horizontal conductive layer 104, and a lower surface thereof may be coplanar with a lower surface of the substrate 101 or may be disposed on a level lower in the z direction than a level of the lower surface of the substrate 101. The interlayer insulating layers 120 may form the stack structure GS with the gate electrodes 130, and may extend to the through wiring region TB and may form the insulating region IR. The sacrificial insulating layers 180 may be disposed on a same level as a level of the gate electrodes 130, and side surfaces thereof may be in physical contact with the gate electrodes 130 on a boundary of the through wiring region TB.

The substrate insulating layer 160, the interlayer insulating layers 120, and the sacrificial insulating layers 180 included in the insulating region IR may be formed of an insulating material. For example, each of the substrate insulating layer 160, the interlayer insulating layers 120, and the sacrificial insulating layers 180 may include silicon oxide. silicon nitride, or silicon oxynitride. For example, even when a portion of the substrate insulating layer 160, the interlayer insulating layers 120, and the sacrificial insulating layers 180 are formed of the same material, physical properties may be different, based on a formation process, a composition, or the like, and accordingly, boundaries therebetween may be distinct from each other. The substrate insulating layer 160 and the sacrificial insulating layers 180 may have the same width or different widths.

The through contact plugs 170 may vertically at least partially penetrate or extend into the entire insulating region IR and may extend perpendicularly to the upper surface of the substrate 101, and may electrically connect the memory cell region CELL to the peripheral circuit region PERI. For example, the through contact plugs 170 may electrically connect the gate electrodes 130 or the channel structures CH of the memory cell region CELL to the circuit devices 220 of the peripheral circuit region PERI. The through contact plugs 170 may be connected to the wiring lines 175, which are upper wiring structures, in an upper portion, but may also be connected to contact plugs in example embodiments. The through contact plugs 170 may be connected to the circuit wiring lines 280, which are lower wiring structures in a lower portion.

The through contact plugs 170 may at least partially penetrate or extend into the interlayer insulating layers 120 and the sacrificial insulating layers 180 of the insulating region IR, and may at least partially penetrate or extend into the substrate insulating layer 160 in a lower portion. The number, a form, and a shape of the through contact plugs 170 disposed through a single insulating region IR may be varied in example embodiments. In example embodiments, the through contact plugs 170 may have a form in which a plurality of layers are vertically connected to each other. Also, in addition to the through contact plugs 170, wiring structures each having a shape of a wiring line may be further disposed in the insulating region IR in example embodiments. The through contact plugs 170 may include a conductive material such as tungsten (W), copper (Cu), aluminum (Al), or the like, for example.

The dummy channel structures DCH may be regularly arranged in the through wiring region TB. The dummy channel structures DCH may not be electrically connected to the upper wiring structures, or may not form a memory cell string in the semiconductor device 100, different from the channel structures CH. As shown in FIG. 2A, the dummy channel structures DCH may be arranged in a pattern similar to that of the channel structures CH. For example, the dummy channel structures DCH may be arranged with a pitch of an integer multiple of a pitch of the channel structures CH taken in the x and y directions. In the example embodiment, "pitch" refers to the minimum length from a center to a center for one kind of element. This configuration will be described in greater detail with reference to FIG. 5.

As shown in FIG. 3, the dummy channel structures DCH may at least partially penetrate or extend into the insulating region IR in the z direction. The dummy channel structures DCH may partially penetrate or extend into the interlayer insulating layers 120 and the sacrificial insulating layers 180 of the insulating region IR. The dummy channel structures DCH may have a second height H2 smaller than a first height H1 of the channel structures CH in the z direction. For example, the second height H2 may be within a range of about 50% to about 90% of the first height H1. Upper surfaces of the dummy channel structures DCH may be disposed on a level substantially the same as a level of upper surfaces of the channel structures CH in a cross-sectional view. Accordingly, lower ends of the dummy channel structures DCH may be disposed on a level higher than a level of lower ends of the channel structures CH as shown in FIG. 3. The lower ends of the dummy channel structures DCH may be spaced apart from the substrate insulating layer 160 and the second horizontal conductive layer 104 in the z direction.

Each of the dummy channel structures DCH may have a second diameter D2 smaller than a first diameter D1 of each of the channel structures CH. A diameter, which is relatively represented in the example embodiment, may refer to a diameter on the same level or may refer to a maximum diameter. For example, the second diameter D2 may be within a range of about 30% to about 90% of the first diameter D1. For example, the second diameter D2 may be within a range of about 40 nm to about 80 nm in an upper end. The first diameter D1 and the second diameter D2 may be smaller than the third diameter D3 of the through contact plug 170. As each of the dummy channel structures DCH has a diameter smaller than the diameter of each of the channel structures CH, the dummy channel structures DCH may be configured to have a relatively small height through the same process. This configuration will be described in greater detail with reference to FIG. 11B.

The dummy channel structures DCH may include the same elements as those of the channel structures CH. A channel layer 140 may be disposed in the dummy channel structures DCH, and in addition to the channel layer 140, the dummy channel structure DCH may include a gate dielectric layer 145, a channel filling insulating layer 150, and a channel pad 155. However, the dummy channel structures DCH may have an internal structure different from that of the channel structures CH. Specifically, the dummy channel structure DCH may have different internal structures on different levels in the z direction. This configuration will be described in greater detail with reference to FIG. 4.

The edge region ER2 in FIG. 2B may correspond to a second edge region ER2 in FIG. 1 and may have a structure similar to a structure of the through wiring region TB as shown in FIG. 2B. However, different from the through wiring region TB, in the edge region ER2, the substrate 101 may not be disposed on the peripheral circuit region PERI. Accordingly, the insulating region IR of the edge region ER2 may be formed of the cell region insulating layer 190. The same description of the dummy channel structures DCH in the through wiring region TB may be applied to the description of the dummy channel structures DCH in the edge region ER2. Also, the first edge region ER1 in FIG. 1 may also have the same structure as that of the edge region ER2.

In the semiconductor device 100, by disposing the dummy channel structures DCH in the through wiring region TB and the edge region ER2, continuity of arrangement and uniformity of pattern with the channel structures CH of the memory cell region CELL may be maintained. Accordingly, during a process of manufacturing the semiconductor device 100, the channel structures CH may be manufactured to have a generally uniform shape, and changes in size and shape may be reduced or prevented. Also, as the dummy channel structures DCH are formed to be shorter than the channel structures CH, defects caused by being connected to the substrate 101 or the first and second horizontal conductive layers 102 and 104 may be reduced or prevented.

A wiring line 175 may form an upper wiring structure electrically connected to the memory cells disposed in the memory cell region CELL. The wiring line 175 may be electrically connected to the gate electrodes 130 or the channel structures CH, for example. The number of contact plugs and wiring lines included in the wiring structure may be varied in example embodiments. The wiring line 175 may include a metal, such as tungsten (W), copper (Cu), aluminum (Al), or the like, for example.

The cell region insulating layer 190 may be configured to at least partially cover the substrate 101, the gate electrodes 130 on the substrate 101, and the peripheral region insulating layer 290. The cell region insulating layer 190 may be formed of an insulating material.

The peripheral circuit region PERI may include a base substrate 201, circuit devices 220 disposed on the base substrate 201, circuit contact plugs 270, and circuit wiring lines 280.

The base substrate 201 may have an upper surface extending in the x direction and the y direction. In the base substrate 201, separate device isolation layers may be formed such that an active region may be defined. Source/drain regions 205 including impurities may be disposed in a portion of the active region. The base substrate 201 may include a semiconductor material, such as a group IV semiconductor, a group III-V compound semiconductor, or a group II-VI compound semiconductor.

The circuit devices 220 may include a planar transistor. Each of the circuit devices 220 may include a circuit gate dielectric layer 222, a spacer layer 224, and a circuit gate electrode 225. The source/drain regions 205 may be disposed in the base substrate 201 on both sides of the circuit gate electrode 225.

The peripheral region insulating layer 290 may be disposed on the circuit device 220 on the base substrate 201. The circuit contact plugs 270 may at least partially penetrate or extend into the peripheral region insulating layer 290 and may be connected to the source/drain regions 205. An electrical signal may be applied to the circuit device 220 by the circuit contact plugs 270. In a region not shown, the circuit contact plugs 270 may be connected to the circuit gate electrode 225 as well. The circuit wiring lines 280 may be connected to the circuit contact plugs 270 and may be disposed in a plurality of layers.

Figure 4:
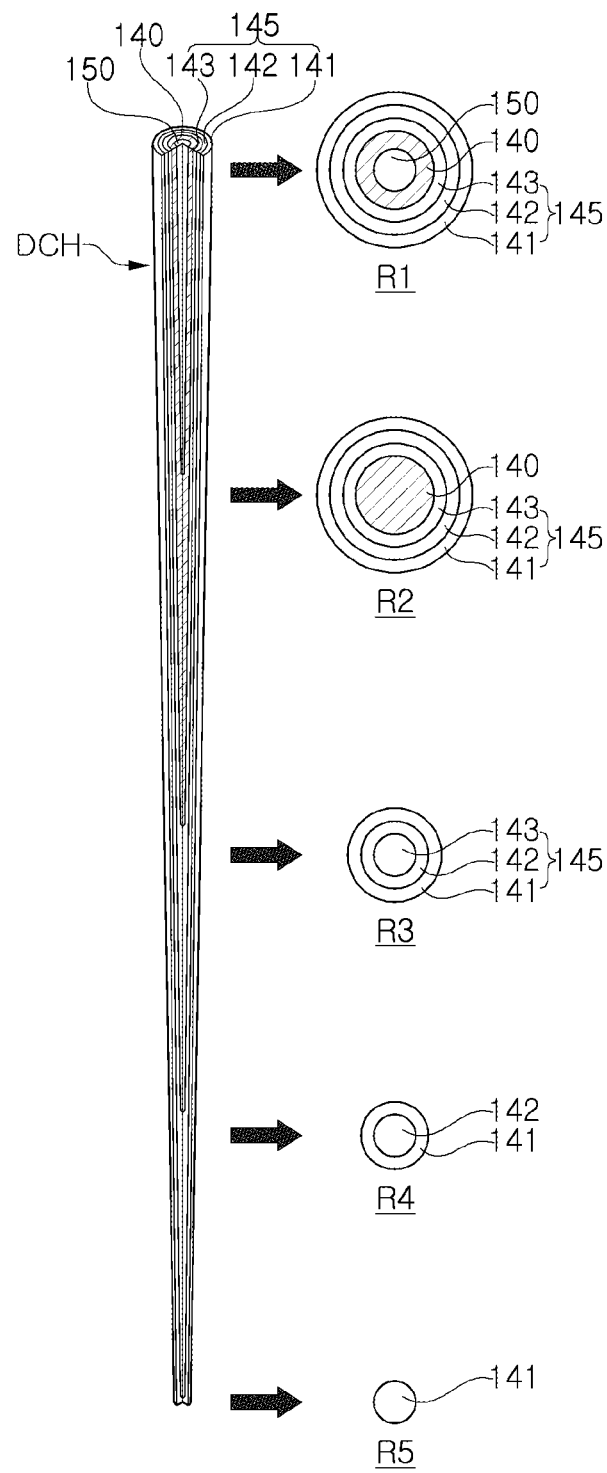
FIG. 4 is a schematic cutaway perspective view illustrating a dummy channel structure of a semiconductor device according to an example embodiment of the present inventive concept.

FIG. 4 is a schematic cutaway perspective view illustrating a dummy channel structure of a semiconductor device according to an example embodiment.

FIG. 4 illustrates dummy channel structures DCH on different levels in the z direction (vertical direction). In FIG. 4, only a lower region of a channel pad 155 is shown. The dummy channel structure DCH may have a smaller diameter and a smaller height than those of a channel structure CH as described above with reference to FIG. 3. Accordingly, at least a portion of the channel layer 140, the gate dielectric layer 145, and the channel filling insulating layer 150 included in the dummy channel structure DCH may not extend from an upper end to a lower end of the dummy channel structure DCH, different from the channel structure CH.

In a first region R1 adjacent to the channel pad 155, a gate dielectric layer 145, the channel layer 140, and the channel filling insulating layer 150 may be disposed in a channel hole of the dummy channel structure DCH in order from an external side. In the first region R1, the dummy channel structure DCH may have a structure corresponding to the channel structure CH.

In a second region R2 below the first region R1, the gate dielectric layer 145 and the channel layer 140 may be disposed in the channel hole of the dummy channel structure DCH in order from an external side. The channel filling insulating layer 150 may not extend to the second region R2.

In a third region R3 below the second region R2, a blocking layer 141, a charge storage layer 142, and a tunneling layer 143 included in the gate dielectric layer 145 may be disposed in the channel hole of the dummy channel structure DCH in order from an external side. The channel layer 140 and the channel filling insulating layer 150 may not extend to the third region R3. Accordingly, the channel layer 140 may not extend along an entire length of the dummy channel structure DCH, and may extend shorter than the gate dielectric layer 145.

In a fourth region R4 below the third region R3, the blocking layer 141 and the charge storage layer 142 included in the gate dielectric layer 145 may be disposed in the channel hole of the dummy channel structure DCH in order from an external side. The tunneling layer 143, the channel layer 140, and the channel filling insulating layer 150 may not extend to the fourth region R4.

In a fifth region R5 including a lower end of the dummy channel structure DCH, the channel hole of the dummy channel structure DCH may be at least partially filled with the blocking layer 141 included in the gate dielectric layer 145. The charge storage layer 142, the tunneling layer 143, the channel layer 140, and the channel filling insulating layer 150 may not extend to the fifth region R5.

In example embodiments, the dummy channel structure DCH may include only a portion of the second to fifth regions R2, R3, R4, and R5. For example, the dummy channel structure DCH may include only the first region R1 and the fifth region R5. The internal structure of the dummy channel structure DCH may be varied based on a diameter of the dummy channel structure DCH, a height of the dummy channel structure DCH, a slope of a side surface of the dummy channel structure DCH, and a thickness of each layer included in the dummy channel structure DCH.

Figure 5:
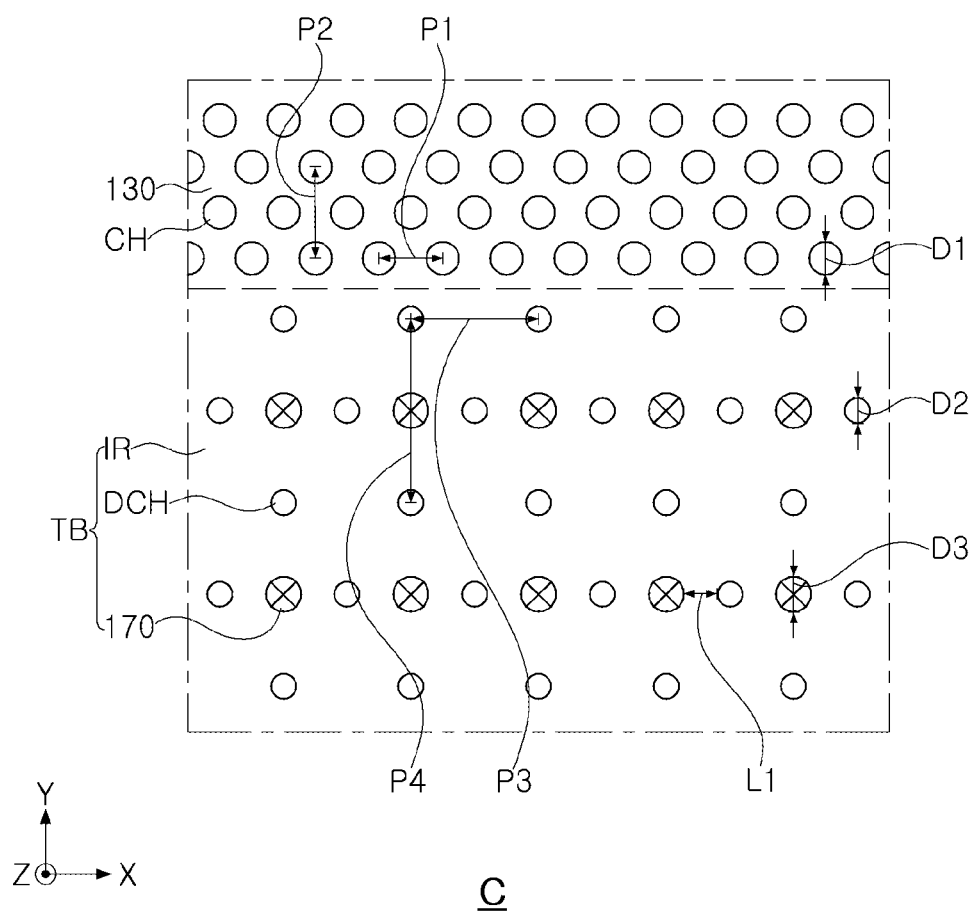
FIG. 5 is a plan view illustrating a semiconductor device according to an example embodiment of the present inventive concept.

FIG. 5 is a plan view illustrating a semiconductor device according to an example embodiment. FIG. 5 illustrates region "C" in FIG. 2A.

FIG. 5 illustrates a through wiring region TB and a dispositional region of channel structures CH adjacent thereto together. The channel structures CH may be disposed with a first pitch P1 in the x direction, and may be disposed with a second pitch P2 in the y direction. In the example embodiment, the first pitch P1 may be different from the second pitch P2. In a region adjacent to the channel structures CH in the through wiring region TB, the dummy channel structures DCH may be disposed with a third pitch P3 in the x direction and may be disposed with a fourth pitch P4 in the y direction. The third pitch P3 may be n times the first pitch P1, which is an integer multiple of the first pitch P1, and the fourth pitch P4 may be m times the second pitch P2, which is an integral multiple of the second pitch P2. For example, the third pitch P3 and the fourth pitch P4 may be 2 to 5 times the first pitch P1 and the second pitch P2, respectively. In the example embodiment, n and m may be the same and may not be 1. As the dummy channel structures DCH are arranged with a pitch of an integer multiple of the channel structures CH, repeatability of the channel structures CH may be maintained.

As described above, each of the dummy channel structures DCH have a second diameter smaller than a first diameter D1 of each of the channel structures CH and a third diameter D3 of each of the through contact plugs 170. The second diameter D2 may be determined to have a size larger than a size of a photolithography process margin caused by the limitation in resolution of an exposure illumination system.

The dummy channel structures DCH may be spaced apart from the through contact plugs 170 by at least a first length L1. The first length L1 may be determined in consideration of a size, a bending degree, a misalignment margin, or the like, of the through contact plugs 170. In an example embodiment, the first length L1 may be within a range of about 1 to 3 times the third diameter D3 of the through contact plugs 170. The relative arrangement of the through contact plugs 170 may be varied in example embodiments. For example, when a region in which a position of the through contact plugs 170 overlaps the arrangement pattern of the dummy channel structures DCH is formed, the dummy channel structure DCH may not be disposed in the overlapping region.

Figure 6A:
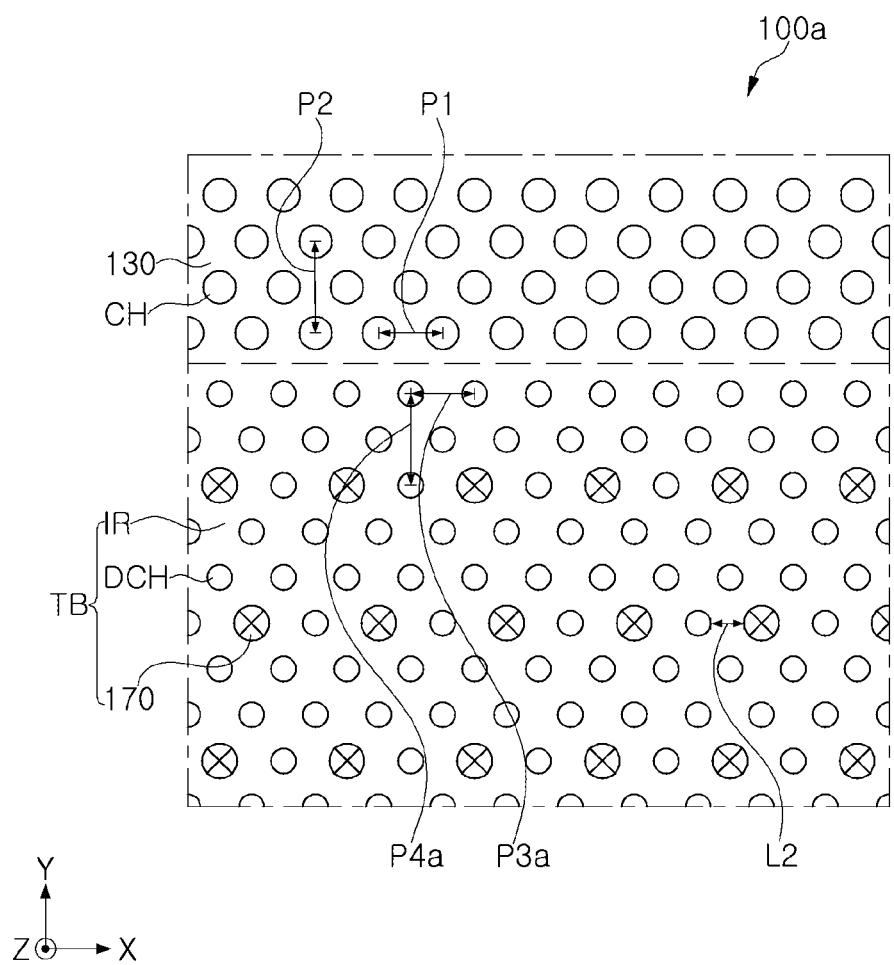
FIGS. 6A to 6C are plan views illustrating a semiconductor device according to an example embodiment of the present inventive concept.
Figure 6B:
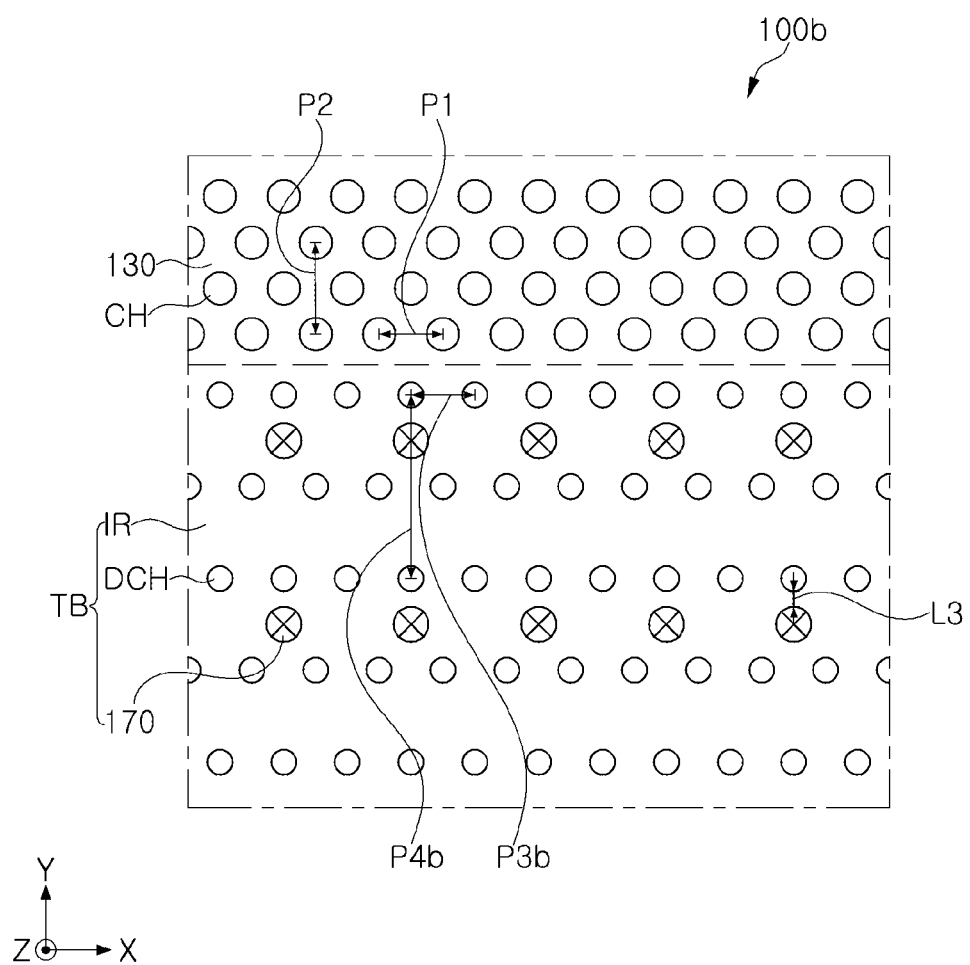
Figure 6C:
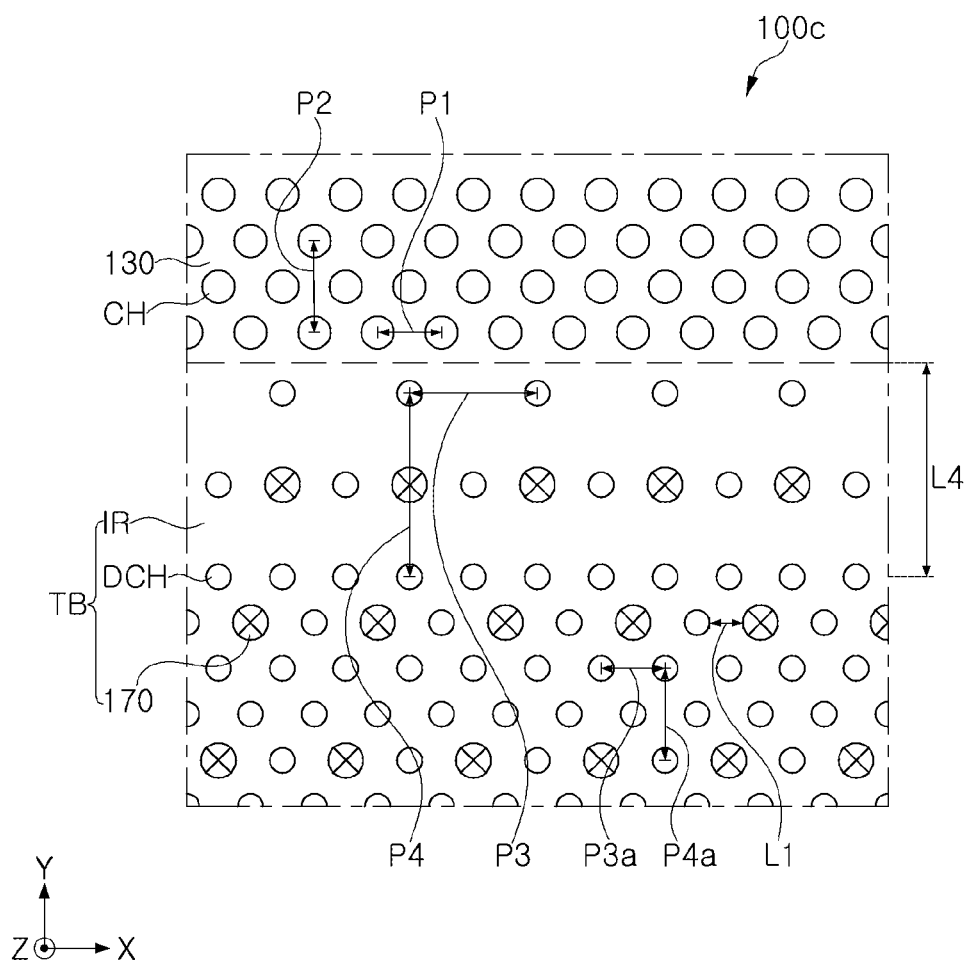

FIGS. 6A to 6C are plan views illustrating a semiconductor device according to an example embodiment showing a region corresponding to FIG. 5.

Referring to FIG. 6A, in a semiconductor device 100a, dummy channel structures DCH of a through wiring region TB may be disposed with a third pitch P3a in the x direction. and may be disposed with a fourth pitch P4a in the y direction. The third pitch P3a may be the same as the first pitch P1, and the fourth pitch P4a may be the same as the second pitch P2. Accordingly, the third pitch P3a and the fourth pitch P4a may be one times the first pitch P1 and the second pitch P2, respectively.

As shown in the view, the dummy channel structures DCH may not be disposed in a region overlapping or adjacent to the through contact plugs 170. The dummy channel structures DCH may be spaced apart from the through contact plugs 170 by at least a second length L2. The second length L2 may be determined in the same manner as the first length L1 described with reference to FIG. 5.

Referring to FIG. 6B, in a semiconductor device 100b, dummy channel structures DCH of a through wiring region TB may be disposed with a third pitch P3b in the x direction, and may be disposed with a fourth pitch P4b in the y direction. The third pitch P3b may be n times the first pitch P1, the fourth pitch P4b may be m times the second pitch P2, and in the example embodiment, n and m may be different from each other.

The dummy channel structures DCH may be spaced apart from the through contact plugs 170 by at least a third length L3. The third length L3 may be determined in the same manner as the first length L1 described with reference to FIG. 5.

Referring to FIG. 6C, in a semiconductor device 100c, dummy channel structures DCH of the through wiring region TB may be disposed with different pitches in different regions. The dummy channel structures DCH may be disposed with relatively large pitches P3 and P4 in a first region adjacent to the channel structures CH as in the example embodiment in FIG. 5, and the dummy channel structures DCH may be disposed with the relatively small pitches P3a and P4a in the second region spaced apart from the channel structures CH by a fourth length L4 as in the example embodiment in FIG. 6A. The fourth length L4 may be determined in consideration of an optical influence range in a photolithography process, and may be greater than about 1 μm, for example. Even in such embodiments, the dummy channel structures DCH may be spaced apart from the through contact plugs 170 by at least a first length L1.

In example embodiments, in the first region, the dummy channel structures DCH may be disposed with a pitch of an integer multiple of the pitch of the channel structures CH, and in the second region, dummy channel structures DCH may be disposed with a pitch which is not an integer multiple of the pitch of the channel structures CH.

Figure 7:
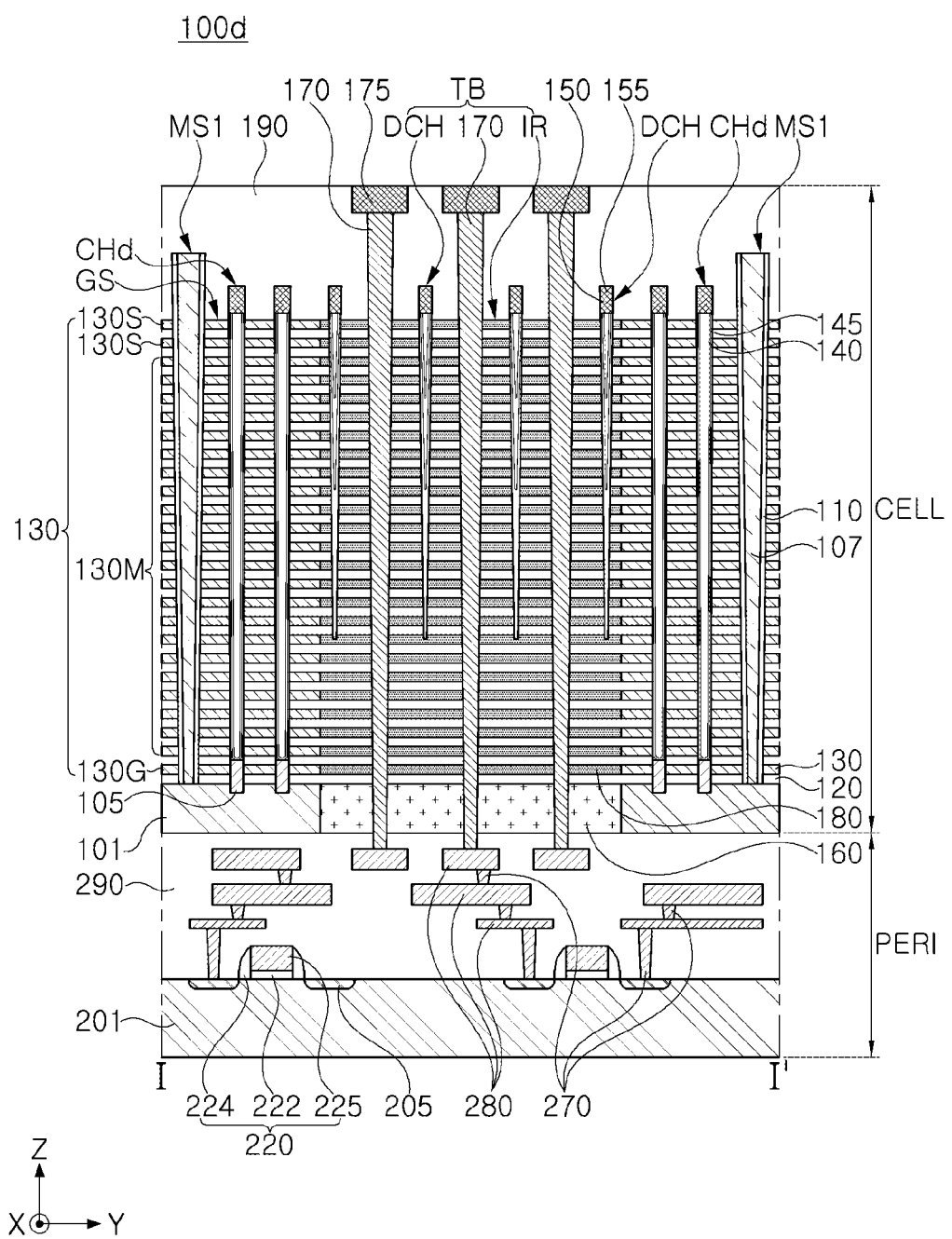
FIG. 7 is a cross-sectional view illustrating a semiconductor device according to an example embodiment of the present inventive concept.

FIG. 7 is a cross-sectional view illustrating a semiconductor device according to an example embodiment.

Referring to FIG. 7, different from the semiconductor device 100 in FIG. 3, a semiconductor device 100d may not include first and second horizontal conductive layers 102 and 104, but may further include epitaxial layers 105 disposed on lower ends of channel structures CH instead. Also, first separation regions MS1, and second separation regions MS2, which is not shown, may further include a source conductive layer 107 disposed between the separation insulating layers 110.

The epitaxial layers 105 may be disposed on the substrate 101 on a lower end of the channel structure CH, and may be disposed on a side surface of at least one gate electrode 130. The epitaxial layers 105 may be disposed in a recessed region of a substrate 101. A level of an upper surface of the epitaxial layers 105 may be higher than a level of an upper surface of a lowermost gate electrode 130 and lower than a level of a lower surface of a gate electrode 130 disposed above the lowermost gate electrode 130 in the z direction, but an example embodiment thereof is not limited thereto. In example embodiments, the dummy channel structures DCH may not include the epitaxial layers 105. This is because the epitaxial layers 105 may be formed from the substrate 101 through a selective epitaxial growth (SEG) process, and the dummy channel structures DCH may be spaced apart from the substrate 101.

The source conductive layer 107 may function as a common source line of the semiconductor device 100d, but an example embodiment is not limited thereto. In example embodiments, the source conductive layer 107 may not be provided.

Figure 8A:
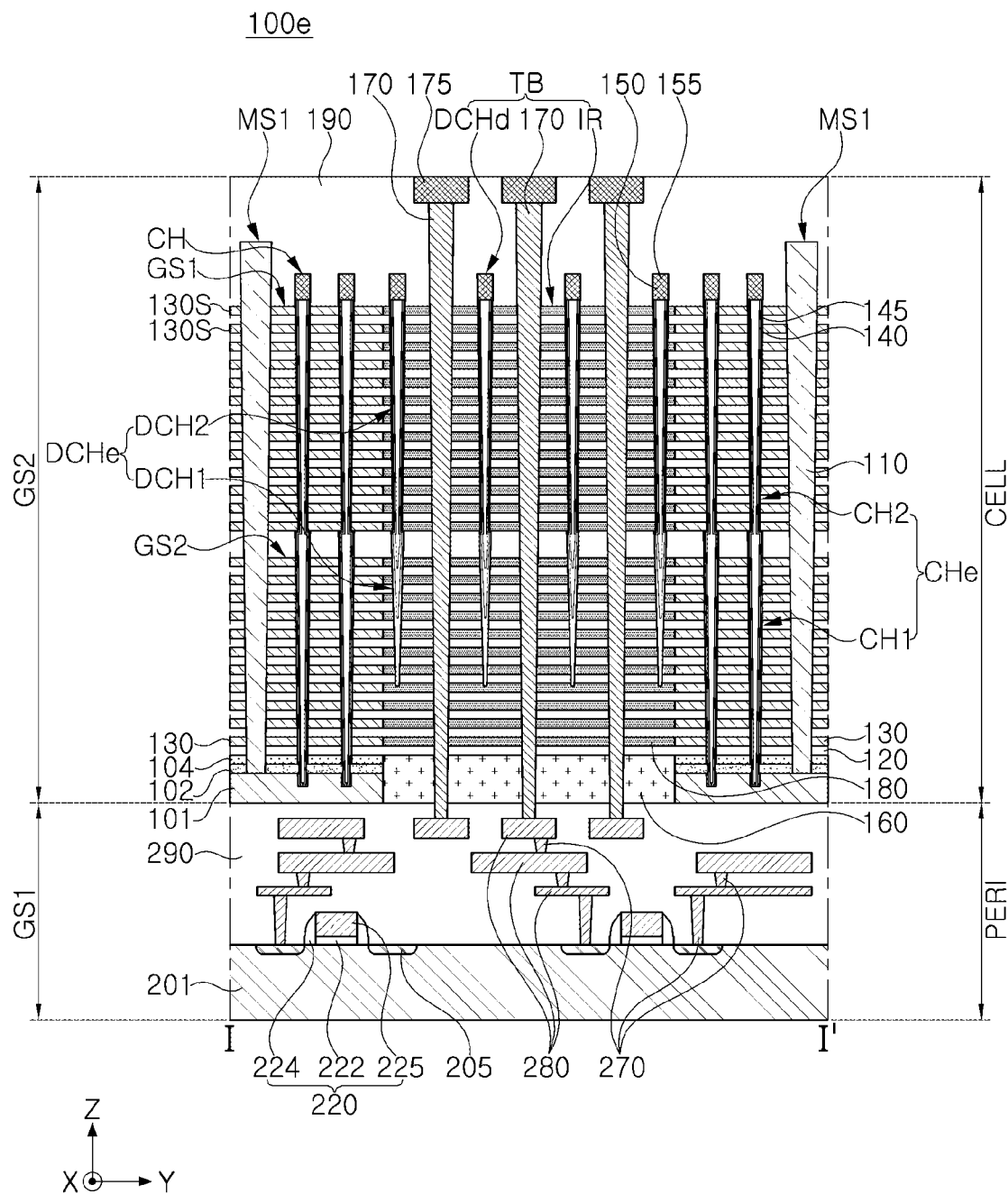
FIGS. 8A and 8B are cross-sectional views illustrating a semiconductor device according to an example embodiment of the present inventive concept.
Figure 8B:
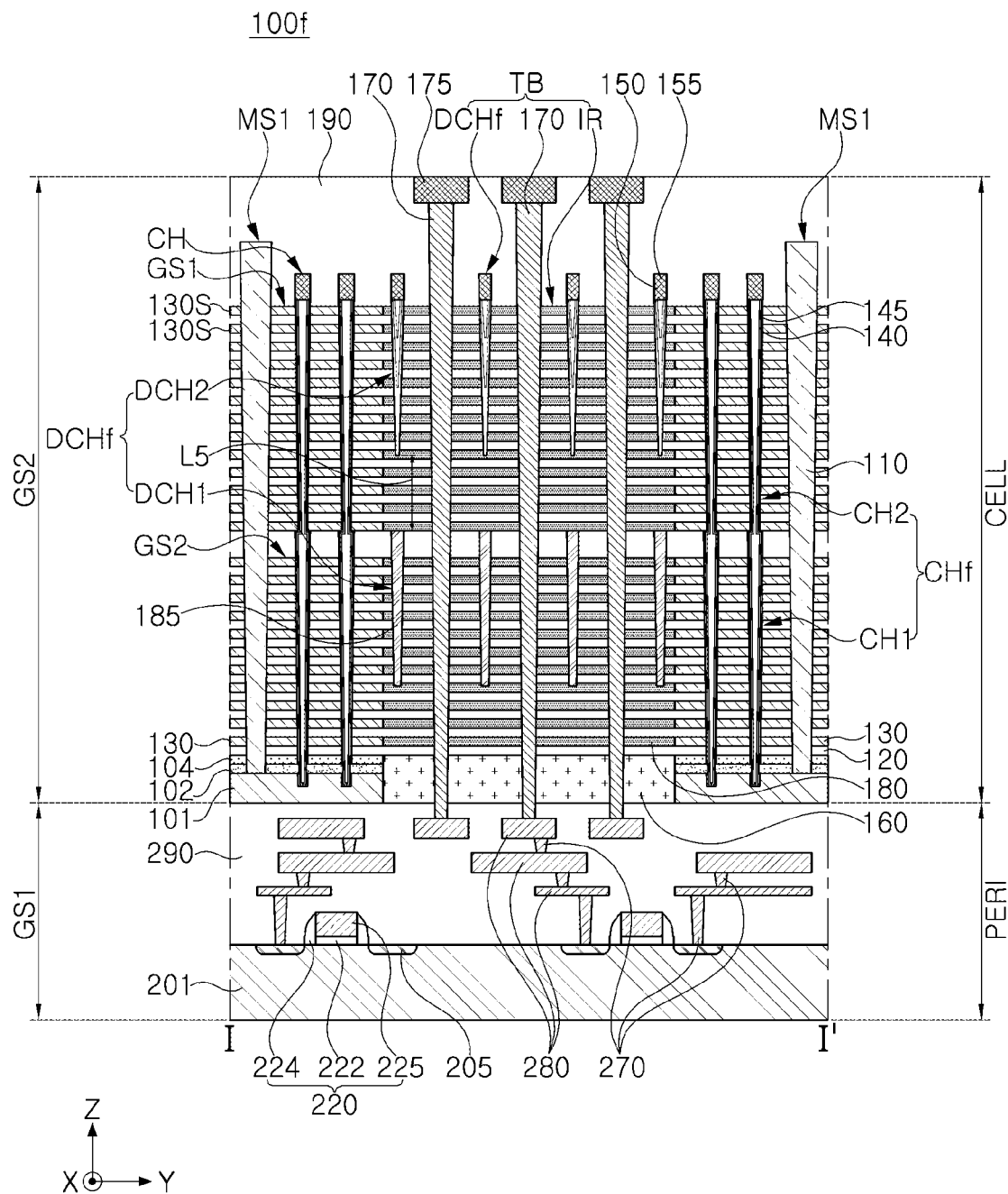

FIGS. 8A and 8B are cross-sectional views illustrating a semiconductor device according to an example embodiment.

Referring to FIG. 8A, a semiconductor device 100e may include first and second stack structures GS1 and GS2 in which a stack structure of gate electrodes 130 is vertically stacked, and channel structures CHe and dummy channel structures DCHe may include first and second channel structures CH1 and CH2 and first and second dummy channel structures DCH1 and DCH2, respectively, which are vertically stacked. The structures of the channel structures CHe and the dummy channel structures DCHe may be included to stably form the channel structures CHe when the number of the stacked gate electrodes 130 is relatively large.

The channel structures CHe may have a form in which first channel structures CH1 of the first stack structure GS1 are connected to second channel structures CH2 of the second stack structure GS2, and the channel structures CHe may have a bent portion formed by a difference in width in a connection region. A channel layer 140, a gate dielectric layer 145, and a channel filling insulating layer 150 may be connected to each other between the first channel structure CH1 and the second channel structure CH2. The channel pad 155 may only be disposed on an upper end of the upper first channel structure CH1. In example embodiments, each of the first channel structure CH1 and the second channel structure CH2 may include a channel pad 155, and in such embodiments, the channel pad of the first channel structure CH1 may be connected to the channel layer 140 of the second channel structure CH2.

The dummy channel structures DCHe may also have a form in which the first dummy channel structures DCH1 are connected to the second dummy channel structures DCH2. In the example embodiment, each of the lower first dummy channel structures DCH1 may have a height and a diameter relatively smaller than those of the first channel structure CH1. Accordingly, the lower ends of the first dummy channel structures DCH1 may be spaced apart from the substrate 101 and a substrate insulating layer 160 in the z direction and may be disposed in an upper portion. The first dummy channel structures DCH1 may have an internal structure as described with reference to FIG. 4. In the example embodiment, the second dummy channel structures DCH2 may have a height and a diameter substantially the same as those of the second channel structure CH2. Accordingly, the second dummy channel structures DCH2 may have substantially the same internal structure as that of the second channel structure CH2.

An upper interlayer insulating layer 125 having a relatively large thickness may be disposed on an uppermost portion of the first stack structure GS1. However, shapes of the interlayer insulating layers 120 and the upper interlayer insulating layer 125 may be varied in example embodiments.

Referring to FIG. 8B, similar to the example embodiment in FIG. 8A, a semiconductor device 100f may include channel structures CHf and dummy channel structures DCHf including first and second channel structures CH1 and CH2 and first and second dummy channel structures DCH1 and DCH2, respectively, which are vertically stacked.

The lower first dummy channel structure DCH1 may have a height and a diameter relatively smaller than those of the first channel structure CH1. Accordingly, lower ends of the first dummy channel structures DCH1 may be spaced apart from a substrate 101 and a substrate insulating layer 160 in the z direction and may be disposed in an upper portion. Also, the first dummy channel structures DCH1 may have a structure different from that of the second dummy channel structure DCH2. Specifically, the first dummy channel structure DCH1 may have a structure at least partially filled with the channel sacrificial layer 185. This structure may be formed as a channel sacrificial layer 185 included in the second dummy channel structure DCH2 may not be removed through a channel hole included in the second dummy channel structure DCH2 and remains when the dummy channel structures DCHf are manufactured.

The upper second dummy channel structure DCH2 may have a height and a diameter relatively smaller than those of the second channel structure CH2. Accordingly, lower ends of the second dummy channel structures DCH2 may be spaced apart from the first dummy channel structure DCH1 in the z direction and may be disposed in an upper portion. The first dummy channel structure DCH1 and the second dummy channel structure DCH2 may be spaced apart from each other by a predetermined length L5, such that the first dummy channel structure DCH1 and the second dummy channel structure DCH2 may not be connected to each other. The length L5 may be varied in example embodiments, and the length may be different in two or more dummy channel structures DCHf. The second dummy channel structures DCH2 may have an internal structure as described with reference to FIG. 4.

FIG. 9 is a cross-sectional view illustrating a semiconductor device according to an example embodiment.

Referring to FIG. 9, in a semiconductor device 100g, a through wiring region EIB may correspond to the second through wiring region ETB shown in FIG. 1, and may include a wiring structure for electrically connecting a memory cell region CELL to a peripheral circuit region PERI.

In the periphery of the through wiring region ETB, the gate electrodes 130 may extend by different lengths in the y direction and may form stepped portions in a staircase shape. Due to the stepped portions, the lower gate electrode 130 may extend farther than the upper gate electrode 130, such that pad regions exposed to an upper portion may be provided. The gate electrodes 130 may be connected to cell contact plugs 177 in the pad regions and may be connected to the upper wiring lines 175.

The through wiring region ETB may include through contact plugs 170 penetrating or extending into the stack structure GS of the gate electrodes 130 and extending in the z direction, an insulating region IR bordering or at least partially surrounding the through contact plugs 170, and dummy through contact plugs 170D at least partially penetrating or extending into the insulating region IR.

The dummy through contact plugs 170D may be regularly arranged in the through wiring region ETB along with the through contact plugs 170. The dummy through contact plugs 170D may not be connected to the upper wiring lines 175. In example embodiments, the dummy through contact plugs 170D may only be disposed on an external side or one side of a region in which the through contact plugs 170 are disposed, or may be disposed between regions in which the through contact plugs 170 are disposed. Similar to the dummy channel structures DCH described above, the dummy through contact plugs 170D may assist the uniform formation of the through contact plugs 170.

The dummy through contact plugs 170D may at least partially penetrate or extend into the insulating region IR in the z direction. Each of the dummy through contact plugs 170D may have a fourth height H4 smaller than a third height H3 of each of the through contact plugs 170 in the z direction. For example, the fourth height H4 may be within a range of about 50% to about 90% of the third height H3. Upper surfaces of the dummy through contact plugs 170D may be disposed on substantially the same level as a level of upper surfaces of the through contact plugs 170 in the z direction. Accordingly, lower ends of the dummy through contact plugs 170D may be disposed on a level higher than a level of lower ends of the through contact plugs 170 in the z direction. The lower ends of the dummy through contact plugs 170D may be spaced apart from the substrate 101 and the substrate insulating layer 160 in the z direction.

Each of the dummy through contact plugs 170D may have a fifth diameter D5 smaller than a fourth diameter D4 of each of the through contact plugs 170. For example, the fifth diameter D5 may be within a range of about 30% to about 90% of the fourth diameter D4. As each of the dummy through contact plugs 170D has a diameter smaller than a diameter of each of the through contact plugs 170, each of the dummy through contact plugs 170D may have a relatively small height through the same process. The dummy through contact plugs 170D may include the same conductive material as that of the through contact plugs 170.

In FIG. 9, a first horizontal conductive layer 102 is shown to extend in the y direction around the substrate insulating layer 160 as well, but an example embodiment thereof is not limited thereto. In example embodiments, first and second source sacrificial layers 111 and 112 (see FIG. 11A) may remain on the substrate 101 in a region in which the gate electrodes 130 are disposed to have stepped portions.

Figure 10:
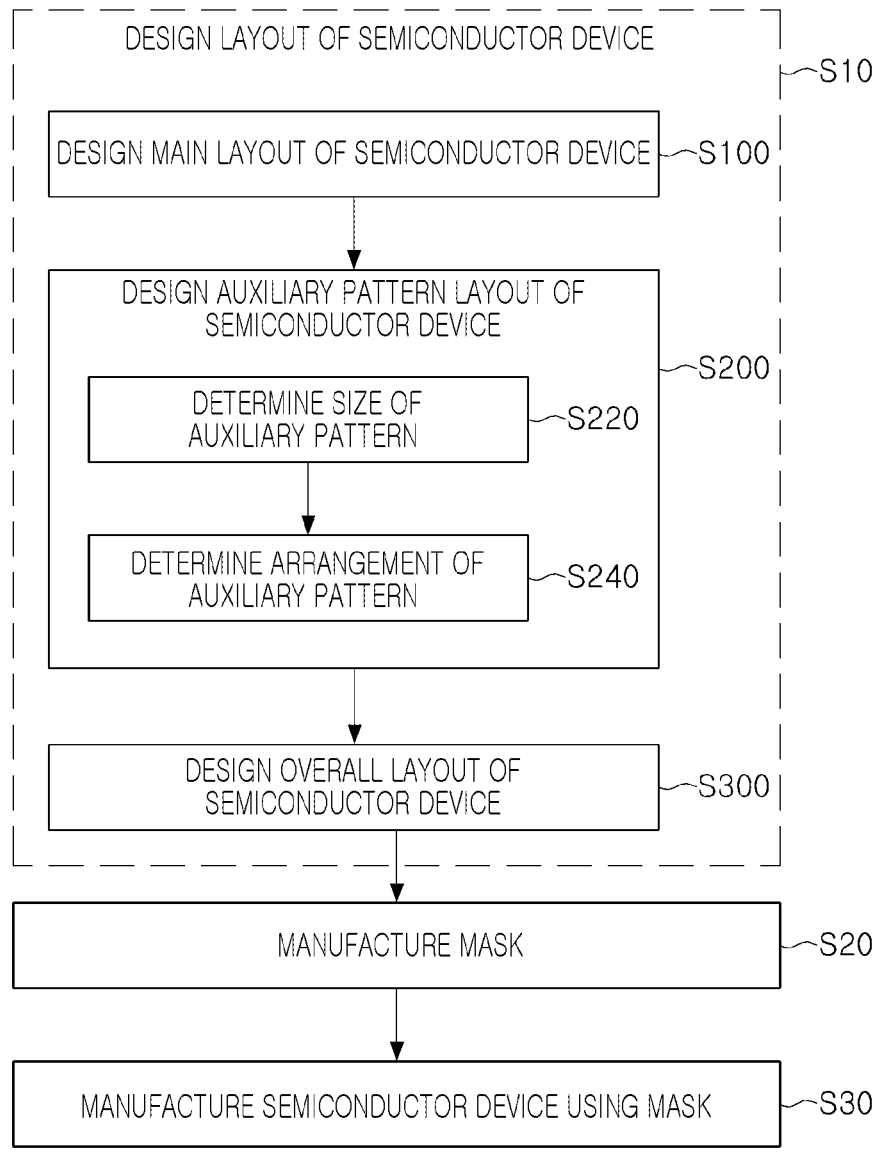
FIG. 10 is a flowchart illustrating a portion of processes of a method of manufacturing a semiconductor device according to an example embodiment of the present inventive concept.

FIG. 10 is a flowchart illustrating a portion of processes of a method of manufacturing a semiconductor device according to an example embodiment.

Referring to FIG. 10, the method of manufacturing a semiconductor device may include designing a layout of the semiconductor device (S10), manufacturing a mask using the layout design (S20), and manufacturing the semiconductor device using the manufactured mask (S30).

The designing a layout of the semiconductor device (S10) may include designing a main layout of the semiconductor device (S100), designing an auxiliary pattern layout of the semiconductor device (S200), and designing an overall layout of the semiconductor device (S300).

In the designing a main layout of the semiconductor device (S100), a main Layout corresponding to a circuit pattern of the semiconductor device to be formed on a wafer may be provided from a host computer or a server of a semiconductor manufacturing facility. Specifically, the layout may be a physical indication by which a circuit designed for the semiconductor device may be transferred onto a wafer, and may include a plurality of patterns. For example, the main layout may be provided from a CAD system as coordinate values of outlines of patterns forming the main layout. Also, the patterns may include repetitive patterns in which the same shape is repeated, and the patterns may be provided in the form of a combination of polygons, such as triangles and/or squares.

The designing an auxiliary pattern layout of the semiconductor device (S200) may include inserting an auxiliary pattern to a region between main patterns of the main layout. The auxiliary pattern may be used in a process enhancement function for assisting the main patterns to be formed without deformation of the shape. For example, the dummy channel structure DCH and the dummy through contact plug 170D described with reference to FIGS. 2A to 9 may correspond to the auxiliary pattern. The designing an auxiliary pattern layout of the semiconductor device (S200) may include determining a size of the auxiliary pattern (S220) and determining arrangement of the auxiliary pattern (S240).

In the determining a size of the auxiliary pattern (S220), an upper limit of a size of the auxiliary pattern may be determined within a range in which the auxiliary pattern does not extend to a certain layer disposed in a lower portion. The size is configured as above so that the auxiliary pattern may not affect an electrical operation of the other elements. For example, a diameter of the dummy channel structure DCH in FIG. 3 may be determined such that the dummy channel structure DCH is not formed to extend to a level of a second horizontal conductive layer 104 or a substrate 101, and a diameter of the dummy through contact plug 170D in FIG. 9 may be determined such that the dummy through contact plug 170D is not formed to extend to a peripheral circuit region PERI. Accordingly, the auxiliary pattern may be determined to have a size smaller than a size of a corresponding main pattern. A lower limit of the size of the auxiliary pattern may be determined in consideration of limitation of a photolithography process.

The determining arrangement of the auxiliary pattern (S240) may include determining a position in which the auxiliary pattern is arranged between the main patterns. The auxiliary patterns may be arranged in an array form, and as described with reference to FIGS. 5 to 6C, the auxiliary patterns may be arranged with a pitch of an integer multiple of a pitch of the main patterns within a predetermined distance from a region in which the main pattern is disposed. For example, the predetermined distance may be determined by a photolithography process technique. Accordingly, uniformity in density may be maintained between the main patterns and the auxiliary patterns, and optical proximity correction (OPC) may be performed for the entire layout. The auxiliary patterns may be spaced apart from the other adjacent main patterns by a predetermined distance according to a design rule. For example, the dummy channel structure DCH in FIG. 3 may be spaced apart from a through contact plug 170 by a predetermined distance.

The designing of an overall layout of the semiconductor device (S300) may include designing an overall layout by combining the main layout design in the designing a main layout of the semiconductor device (S100) with the layout design of the auxiliary pattern determined in the designing an auxiliary pattern layout of the semiconductor device (S200).

The manufacturing a mask using the layout design (S20) may include manufacturing a mask according to the designed layout data. A mask may be manufactured by performing an exposure process on a mask substrate using the layout data. After the exposure process, the mask may be formed by further performing a series of processes, such as development, etching, cleaning, and baking. In example embodiments, before transmitting the layout data, verification for the layout data may be performed.

The manufacturing the semiconductor device using the manufactured mask (S30) may include performing a lithography process using the mask and performing a deposition process, an etching process, an ion implantation process, a cleaning process, or the like. Also, the semiconductor device may be manufactured by performing a process of forming an upper semiconductor structure including repetitive main patterns on a lower semiconductor structure. The repetitive main patterns may be formed without a degradation of a critical dimension even in the edge region by the mask reflecting the layout of the auxiliary pattern.

FIGS. 11A to 11F are cross-sectional views illustrating a method of manufacturing a semiconductor device according to an example embodiment, illustrating regions corresponding to the regions in FIG. 3.

Figure 11A:
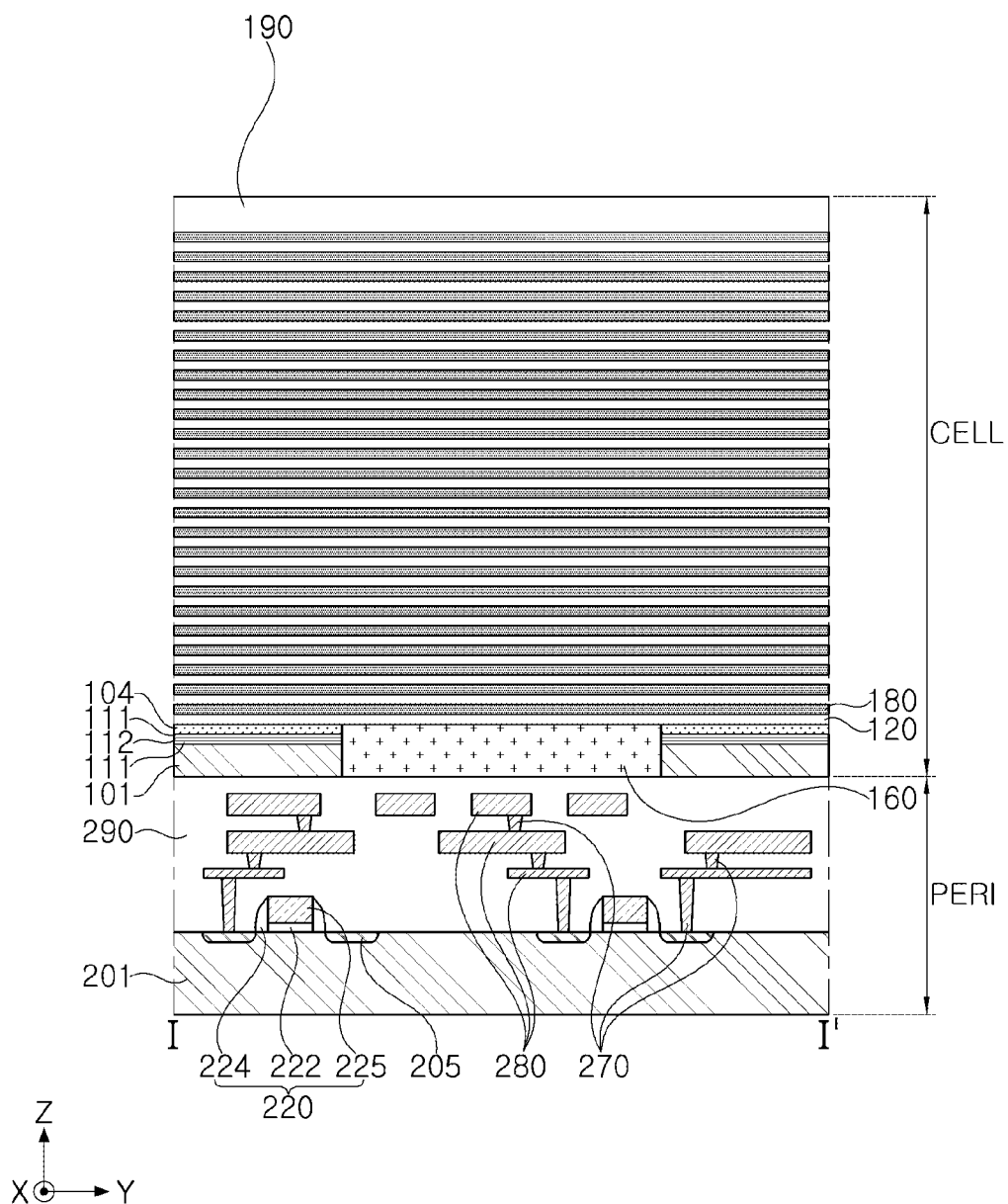
FIGS. 11A to 11F are cross-sectional views illustrating a method of manufacturing a semiconductor device according to an example embodiment of the present inventive concept.

Referring to FIG. 11A, a peripheral circuit region PERI including circuit devices 220 and lower wiring structures may be formed on a base substrate 201, a substrate 101 on which a memory cell region is provided, first and second source sacrificial layers 111 and 112, a second horizontal conductive layer 104, and a substrate insulating layer 160 may be formed above the peripheral circuit region PERI, and sacrificial insulating layers 180 and interlayer insulating layers 120 may be alternately stacked.

First, a circuit gate dielectric layer 222 and a circuit gate electrode 225 may be formed in order on the base substrate 201. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polysilicon or metal silicide layers, but example embodiments thereof are not limited thereto. Thereafter, a spacer layer 224 and source/drain regions 205 may be formed on both sides of the circuit gate dielectric layer 222 and the circuit gate electrode 225. In example embodiments, the spacer layer 224 may include a plurality of layers. Thereafter, the source/drain regions 205 may be formed by performing an ion implantation process.

Among the lower wiring structures, circuit contact plugs 270 may be formed by partially forming a peripheral region insulating layer 290, partially removing the peripheral region insulating layer 290 by etching, and at least partially filling the etched region with a conductive material. Lower wiring lines 280 may be formed by depositing a conductive material and patterning the conductive material, for example.

The peripheral region insulating layer 290 may include a plurality of insulating layers. The peripheral region insulating layer 290 may be partially formed in each of the processes for forming the lower wiring structures and may be partially formed on the uppermost lower wiring line 280, such that that the peripheral region insulating layer 290 may be formed to at least partially cover the circuit devices 220 and the lower wiring structures.

Thereafter, the substrate 101 may be formed on the peripheral region insulating layer 290. The substrate 101 may be formed of polycrystalline silicon, for example, and may be formed by a CVD process. Polycrystalline silicon included in the substrate 101 may include impurities. The substrate 101 may be configured to have a size smaller than or equal to a size of the base substrate 201.

The first and second source sacrificial layers 111 and 112 may be stacked on the substrate 101 such that the first source sacrificial layers 111 may be disposed above and below the second source sacrificial layer 112. The first and second source sacrificial layers 111 and 112 may include different materials. The first and second source sacrificial layers 111 and 112 may be replaced with the first horizontal conductive layer 102 in FIG. 3 through a subsequent process. For example, the first source sacrificial layer 221 may be formed of a material the same as a material of the interlayer insulating layers 120, and the second source sacrificial layer 112 may be formed of a material the same as a material of the sacrificial insulating layers 180. The second horizontal conductive layer 104 may be formed on the first and second source sacrificial layers 111 and 112.

The substrate insulating layer 160 may be formed by partially removing substrate 101, the first and second source sacrificial layers 111 and 112, and the second horizontal conductive layer 104 in a region corresponding to the through wiring region TB and at least partially filling the removed region with an insulating material. After at least partially filling an insulating material, a planarization process may be performed through a chemical mechanical polishing (CMP) process. Accordingly, an upper surface of the substrate insulating layer 160 may be substantially coplanar with an upper surface of the second horizontal conductive layer 104.

The sacrificial insulating layers 180 may be partially replaced with gate electrodes 130 (see FIG. 3) through a subsequent process. The sacrificial insulating layers 180 may be formed of a material different from a material of the interlayer insulating layers 120, and may be formed of a material etched with etch selectivity for the interlayer insulating layers 120 under predetermined etching conditions. For example, the interlayer insulating layer 120 may be formed of at least one of silicon oxide and/or silicon nitride, and the sacrificial insulating layers 180 may be formed of a material selected from among silicon, silicon oxide, silicon carbide, and/or silicon nitride, and the material may be different from a material of the interlayer insulating layer 120. In example embodiments, the interlayer insulating layers 120 may not have the same thickness. The thicknesses of the interlayer insulating layers 120 and the sacrificial insulating layers 180 and the number of layers of the interlayer insulating layers 120 and the sacrificial insulating layers 180 may be varied from the example shown in the view.

Thereafter, a cell region insulating layer 190 at least partially covering an upper portion of a stack structure of the sacrificial insulating layers 180 and the interlayer insulating layers 120 may be formed.

Figure 11B:
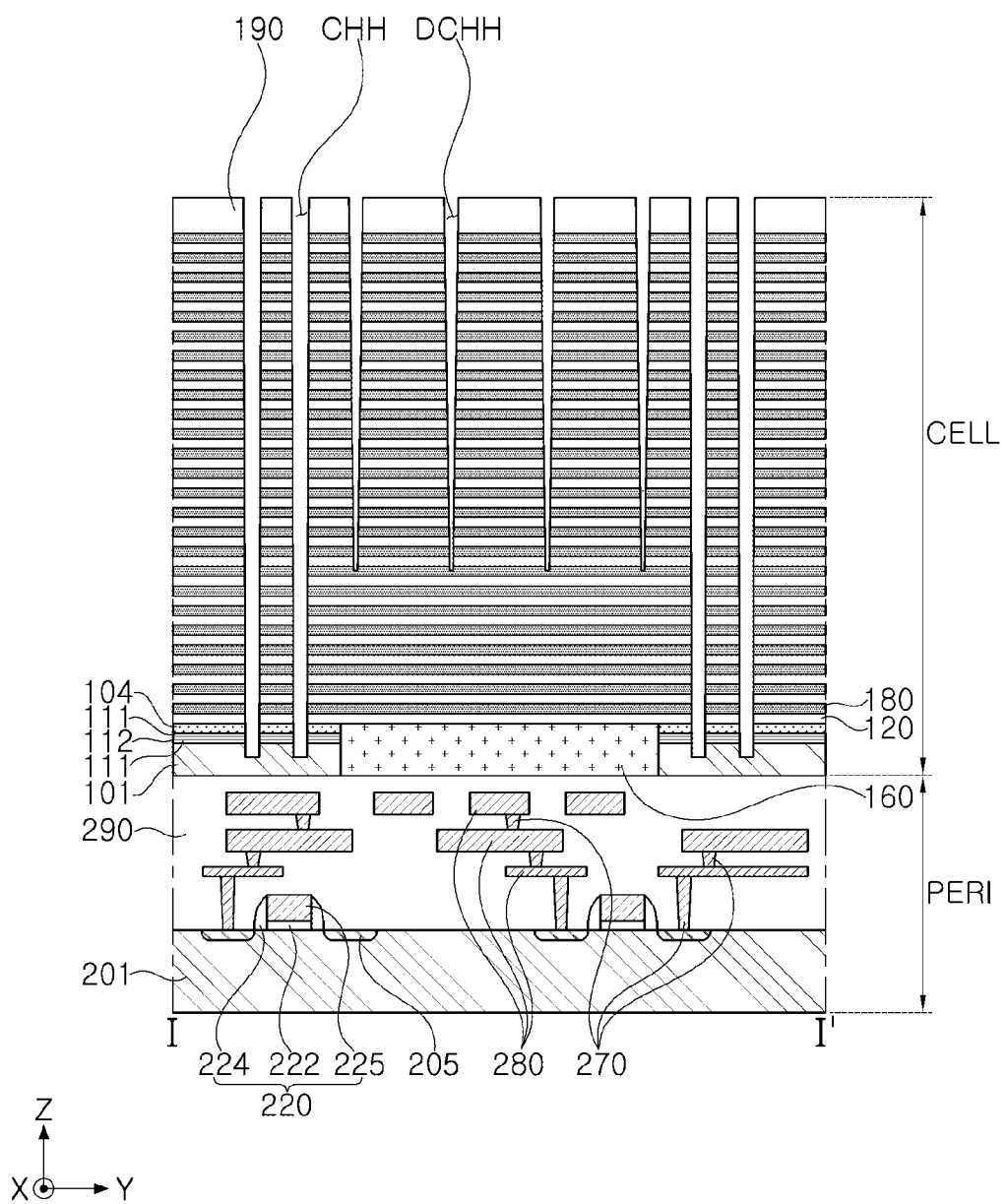

Referring to FIG. 11B, channel holes CHH and dummy channel holes DCHH at least partially penetrating or extending into the stack structure of the sacrificial insulating layers 180 and the interlayer insulating layers 120 may be formed.

First, a string separation region SS (see FIG. 2A) may be formed by partially removing the sacrificial insulating layers 180 and the interlayer insulating layers 120 in a region not shown in the view. The string separation region SS may be formed by exposing a region in which the string separation region SS is formed using a mask layer, removing a predetermined number of the sacrificial insulating layers 180 and the interlayer insulating layers 120 from an uppermost portion, and depositing an insulating material. The string separation region SS may extend farther below the region in which the upper gate electrodes 130S in FIG. 3 are formed.

The channel holes CHH and the dummy channel holes DCHH may be formed by anisotropic etching the sacrificial insulating layers 180 and the interlayer insulating layers 120, and may be formed in a hole shape. By using a patterned mask layer, the dummy channel holes DCHH may be etched to have a smaller diameter than those of the channel holes CHH. The mask layer may be manufactured by the processes described with reference to FIG. 10. As each of the dummy channel holes DCHH has a diameter smaller than that of the channel holes CHH, the dummy channel holes DCHH may be formed to have a relatively small depth during the etching process.

Due to the height of the stack structure, sidewalls of the channel holes CHH and the dummy channel holes DCHH may not be perpendicular to the upper surface of the substrate 101. The channel holes CHH may be partially recessed into the substrate 101.

By forming the dummy channel holes DCHH for the dummy channel structure DCH together with the channel holes CHH for the channel structure CH, the channel holes CHH may be configured to have a generally uniform size and shape even in an edge of the region in which the channel holes CHH are disposed. Accordingly, non-uniformity of the pattern may be reduced or minimized such that deformation of the pattern may be reduced. Also, electrical properties of the channel structures CH formed subsequently may be secured.

Figure 11C:
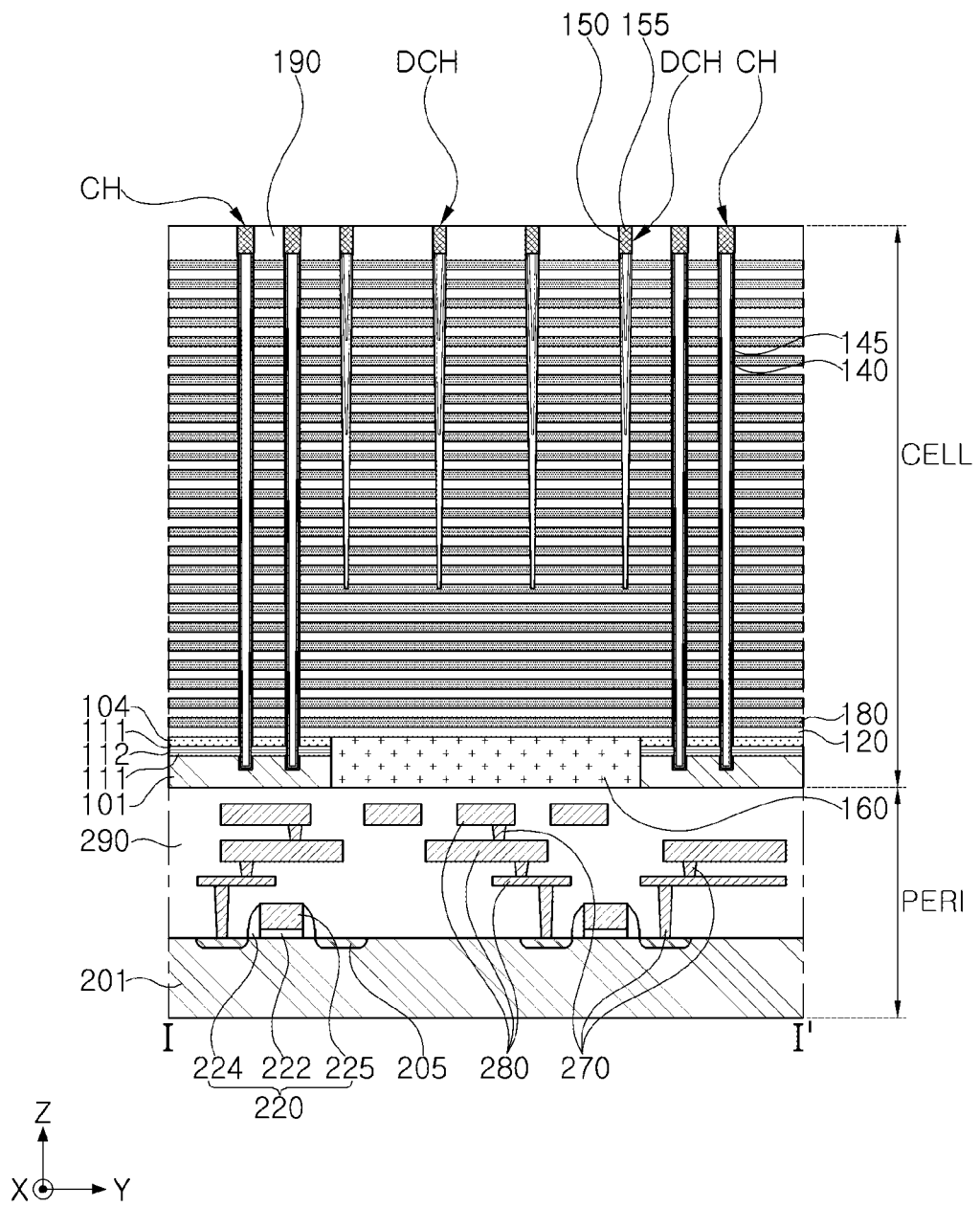

Referring to FIG. 11C, by forming at least a portion of the gate dielectric layer 145, the channel layer 140, the channel filling insulating layer 150, and the channel pads 155 in order in the channel holes CHH and the dummy channel holes DCHH, the channel structures CH and the dummy channel structures DCH may be formed.

The gate dielectric layer 145 may be formed to have a generally uniform thickness using an ALD or CVD process. In this process, all or a portion of the gate dielectric layer 145 may be formed, and a portion extending perpendicular to the substrate 101 along the channel holes CHH and the dummy channel holes DCHH may be formed in this process. The channel layer 140 may be formed on the gate dielectric layer 145 in the channel holes CHH and the dummy channel holes DCHH. The channel filling insulating layer 150 may fill the channel holes CHH and the dummy channel holes DCHH, and may be formed of an insulating material. In example embodiments, a region between the channel layers 140 may be at least partially filled with a conductive material rather than the channel filling insulating layer 150. The channel pad 155 may be formed of a conductive material, such as polycrystalline silicon, for example.

The dummy channel structures DCH may be formed simultaneously or in conjunction with the channel structures CH but may have a relatively smaller diameter and height, such that the dummy channel structures DCH may have a height region having an internal structure different from that of the channel structures CH, and at least a portion of the gate dielectric layer 145, the channel layer 140, and the channel filling insulating layer 150 may not extend to a lower end in the z direction. Also, layers disposed on an external side of the dummy channel holes DCHH may extend relatively deeply in the z direction.

Figure 11D:
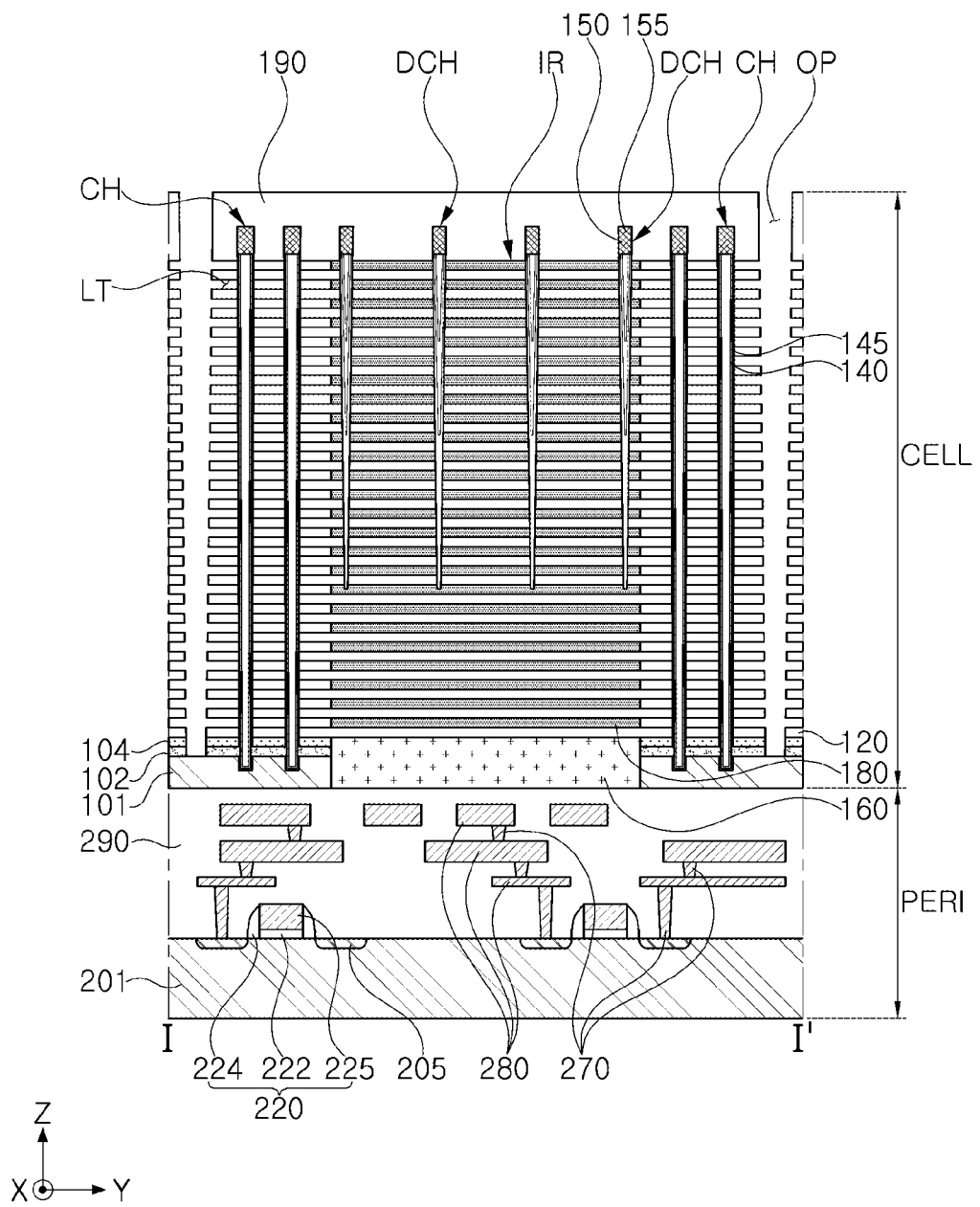

Referring to FIG. 11D, openings OP penetrating or extending into the stack structure of the sacrificial insulating layers 180 and the interlayer insulating layers 120 may be formed, and the sacrificial insulating layers 180 may be at least partially removed through the openings OP, thereby forming tunnel portions LT.

First, before the openings OP are formed, the cell region insulating layer 190 may be formed on the channel structures CH and the dummy channel structures DCH. The openings OP may be formed in positions of the first and second separation regions MS1 and MS2 shown in FIG. 2A. The openings OP may be formed by forming a mask layer using a photolithography process and anisotropically etching the stack structure. The openings OP may be formed in a trench shape extending in the x direction, and the substrate 101 may be exposed below the openings OP.

Before the process of removing the sacrificial insulating layers 180, sacrificial spacer layers may be formed in the openings OP, the second source sacrificial layer 112 may be selectively removed, and the first source sacrificial layers 111 may be removed. The first and second source sacrificial layers 111 and 112 may be removed by a wet etching process, for example. During the process of removing the first source sacrificial layers 111, the gate dielectric layer 145 exposed in the region from which the second source sacrificial layer 112 is removed may also be partially removed. The first horizontal conductive layer 102 may be formed by depositing a conductive material in the region from which the first and second source sacrificial layers 111 and 112 are removed, and the sacrificial spacer layers may be removed from the openings OP.

Thereafter, the sacrificial insulating layers 180 may be removed from an external region of the through wiring region TB (see FIG. 3), that is, an external side of the insulating region IR. Accordingly, the insulating region IR of the through wiring region TB including the interlayer insulating layers 120, the sacrificial insulating layers 180, and the substrate insulating layer 160 may be defined. The sacrificial insulating layers 180 may be selectively removed with respect to the interlayer insulating layers 120 and the substrate insulating layer 160 through wet etching, for example. Accordingly, a plurality of tunnel portions LT may be formed between the interlayer insulating layers 120, and a portion of sidewalls of the channel structures CH and the dummy channel structures DCH may be exposed through the tunnel portions LT.

The region in which the through wiring region TB is formed may be spaced apart from the openings OP, such that an etchant may not reach the region, and accordingly, the sacrificial insulating layers 180 may remain in the region. Accordingly, the through wiring region TB may be formed in a center of the openings OP between the openings OP adjacent to each other. The region in which the sacrificial insulating layers 180 remain may not exactly match the region in which the substrate insulating layer 160 is disposed.

Figure 11E:
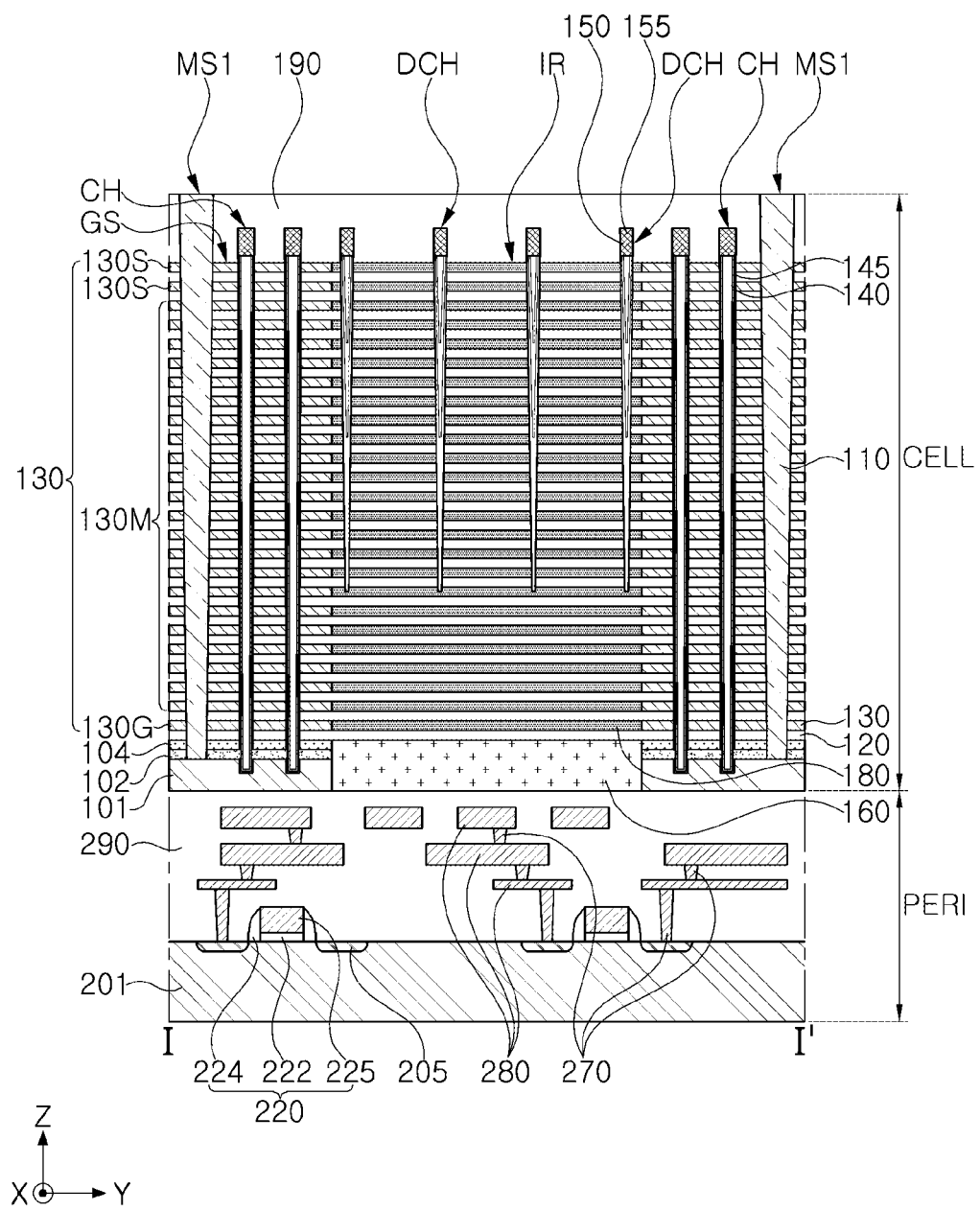

Referring to FIG. 11E, the gate electrodes 130 may be formed by at least partially filling the tunnel portions LT from which the sacrificial insulating layers 180 are partially removed, and a separation insulating layer 110 may be formed in the openings OP.

The conductive material forming the gate electrodes 130 may at least partially fill the tunnel portions LT. The conductive material may include a metal, polycrystalline silicon, and/or metal silicide material. Side surfaces of the gate electrodes 130 may be in physical contact with side surfaces of the sacrificial insulating layers 180 disposed in the insulating region IR. Alter the gate electrodes 130 are formed, the conductive material deposited in the openings OP may be removed through an additional process.

The separation insulating layer 110 may be formed in the form of a spacer in the openings OP. That is, after depositing the insulating material, the insulating material formed on the substrate 101 may be removed from the lower portions of the openings OP, such that the separation insulating layer 110 may be formed.

Figure 11F:
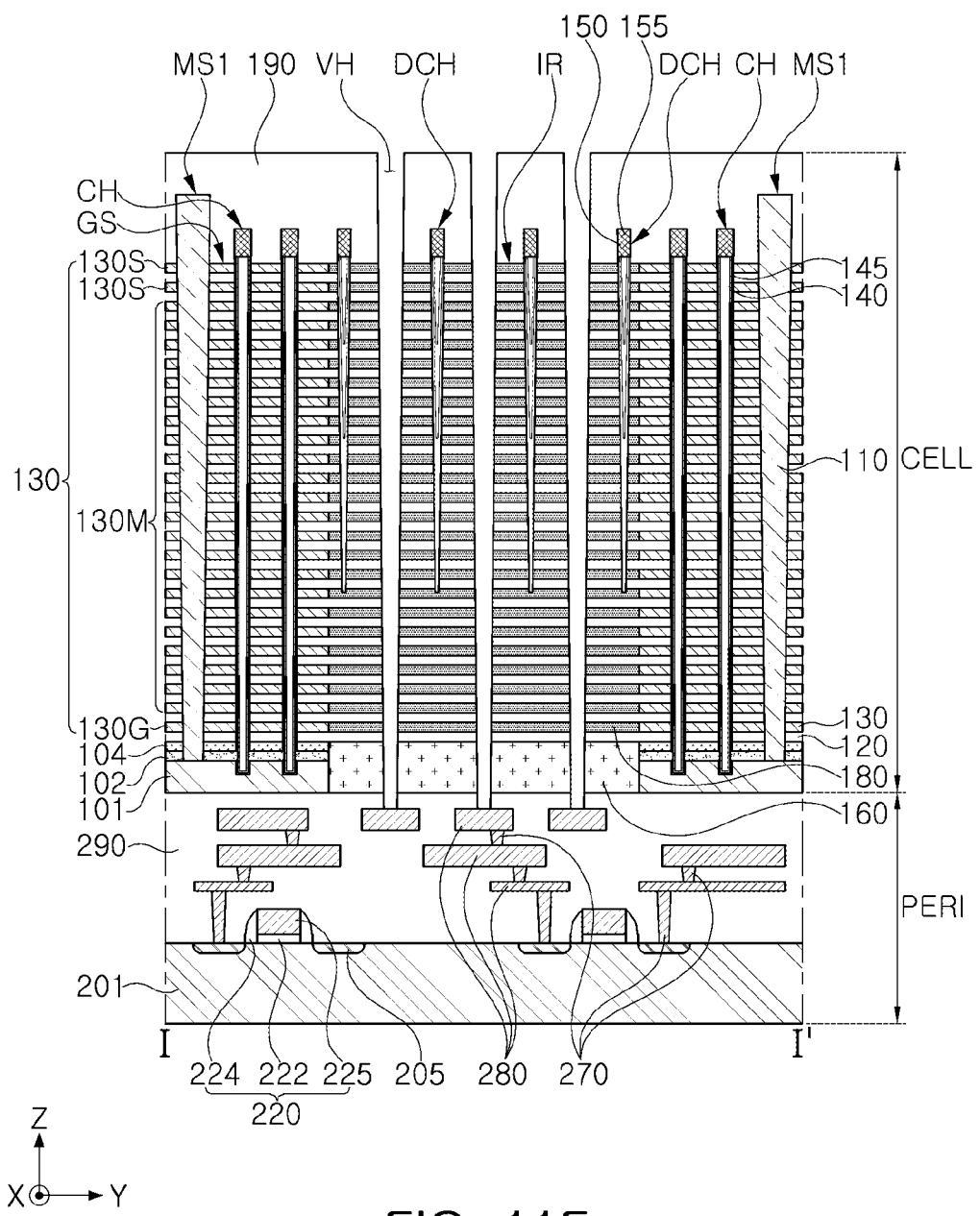

Referring to FIG. 11F, via holes VH for forming the through contact plugs 170 may be formed.

Before the via holes VH are formed, the cell region insulating layer 190 may further be formed to at least partially cover the separation insulating layer 110. Thereafter, contact holes VH penetrating or extending into the cell region insulating layer 190 and the insulating region IR may be formed from an upper portion of the insulating region IR.

The circuit wiring line 280 of the peripheral circuit region PERI may be exposed on lower ends of the contact holes VH.

Thereafter, referring back to FIG. 3, the through wiring region TB may be formed by forming the through contact plugs 170 by at least partially filling the via holes VH with a conductive material, and the wiring line 175 connected to upper ends of the through contact plugs 170 may be formed, thereby manufacturing the semiconductor device 100. The manufacturing method described with reference to FIGS. 11A to 11F is an example of manufacturing the semiconductor device 100 of FIGS. 2A to 5, according to some embodiments, and the semiconductor device 100 may also be manufactured by various manufacturing methods.

According to the aforementioned example embodiments, by disposing dummy channel structures each having a diameter and a height different from those of the channel structures and having an arrangement form similar to that of the channel structures, a semiconductor device having improved reliability may be provided.

While the example embodiments have been shown and described above, it will be apparent to those skilled in the art that modifications and variations could be made without departing from the scope of the present disclosure as defined by the appended claims,

What is claimed is:

1. A semiconductor device, comprising:
a peripheral circuit region including a first substrate and circuit devices on the first substrate;
a memory cell region including a second substrate on the first substrate, gate electrodes stacked in a first direction perpendicular to an upper surface of the second substrate and spaced apart from each other, and channel structures extending in the gate electrodes in the first direction, each of the channel structures including a channel layer; and
a through wiring region adjacent to the channel structures and electrically connecting the peripheral circuit region to the memory cell region,
wherein the through wiring region includes:
an insulating region side by side with the second substrate and the gate electrodes;
a through contact plug extending through the insulating region in the first direction; and
dummy channel structures partially extending into an upper portion of the insulating region, each of the dummy channel structures including the channel layer,
wherein each of the channel structures has a first height in the first direction, and each of the dummy channel structures has a second height smaller than the first height, and
wherein the channel structures are arranged with a first pitch in a second direction perpendicular to the first direction, and the dummy channel structures are arranged with a second pitch different from the first pitch in the second direction in a region adjacent to at least one of the channel structures.

2. The semiconductor device of claim 1, wherein a level of a lower end of each of the dummy channel structures is higher than a level of a lower end of each of the channel structures in the first direction with the first substrate providing a base reference level.

3. The semiconductor device of claim 1, wherein each of the channel structures has a first diameter, and each of the dummy channel structures has a second diameter smaller than the first diameter.

4. The semiconductor device of claim 3, wherein the second diameter is within a range of about 30% to about 90% of the first diameter.

5. The semiconductor device of claim 1, wherein each of the channel structures and the dummy channel structures includes a gate dielectric layer in physical contact with the gate electrodes, the channel layer on the gate dielectric layer, a channel filling insulating layer on the channel layer, and a channel pad on the channel layer.

6. The semiconductor device of claim 5, wherein, in the dummy channel structures, the channel layer extends downwardly from the channel pad towards the first substrate in the first direction and extends shorter in the first direction than the gate dielectric layer.

7. The semiconductor device of claim 6,
wherein each of the dummy channel structures has a first region adjacent to the channel pad and a second region including a lower end extending in the first direction towards the first substrate, and
wherein the gate dielectric layer, the channel layer, and the channel filling insulating layer are in the first region, and the gate dielectric layer is in the second region.

8. The semiconductor device of claim 1, further comprising:
a horizontal conductive layer extending perpendicular to the first direction between the gate electrodes and the second substrate and directly in physical contact with the channel layer of each of the channel structures.

9. The semiconductor device of claim 1,
wherein the through wiring region has a first region adjacent to the channel structures and a second region spaced apart from the channel structures with the first region therebetween, and
wherein the dummy channel structures have different pitches in the first region and the second region, respectively.

10. The semiconductor device of claim 1,
wherein the insulating region includes a first insulating layer including a region on a same level as a level of the second substrate in the first direction, and second insulating layers and third insulating layers alternately stacked on the first insulating layer, and
wherein the dummy channel structures partially extend into the second insulating layers and the third insulating layers.

11. A semiconductor device, comprising:
a peripheral circuit region including a first substrate and circuit devices on the first substrate;
a memory cell region including a second substrate on the first substrate, a horizontal conductive layer on the second substrate, gate electrodes stacked on the horizontal conductive layer in a first direction perpendicular to an upper surface of the second substrate and spaced apart from each other, and channel structures extending in the gate electrodes in the first direction, each of the channel structures including a channel layer in physical contact with the horizontal conductive layer; and
a through wiring region including a through contact plug extending in the first direction and electrically connecting the memory cell region to the peripheral circuit region, an insulating region bordering the through contact plug, and dummy channel structures partially extending into the insulating region, in the first direction, each of the dummy channel structures including the channel layer and being spaced apart from the horizontal conductive layer in the first direction,
wherein each of the channel structures has a first height in the first direction, and each of the dummy channel structures has a second height smaller than the first height.

12. The semiconductor device of claim 11, wherein the channel structures are arranged with a first pitch in a second direction perpendicular to the first direction, and the dummy channel structures are arranged with a second pitch, an integer multiple of the first pitch, in the second direction in a first at least one region.

13. The semiconductor device of claim 12, wherein the dummy channel structures are arranged with a third pitch different from the second pitch in a second at least one region.

14. The semiconductor device of claim 11, wherein each of the dummy channel structures have a first internal structure different from a second internal structure of each of the channel structures.

15. The semiconductor device of claim 11, wherein each of the channel structures has a first diameter, each of the dummy channel structures has a second diameter smaller than the first diameter, and the through contact plug has a third diameter greater than the first diameter.

16. A semiconductor device, comprising:
a substrate;
gate electrodes stacked on the substrate and spaced apart from each other;
channel structures extending in the gate electrodes in a first direction perpendicular to an upper surface of the substrate, each of the channel structures including a channel layer;
an insulating region side by side with the gate electrodes in a second direction perpendicular to the first direction; and
dummy channel structures extending into the insulating region in the first direction, each of the dummy channel structures including the channel layer,
wherein each of the dummy channel structures has a first region in an upper portion of the insulating region along the first direction and includes the channel layer, and a second region, which includes a lower end along the first direction and does not include the channel layer,
wherein the lower end of each of the dummy channel structures is at a level higher than a level of a lower end of each of the channel structures in the first direction with the substrate providing a base reference level.

17. The semiconductor device of claim 16, wherein a gate dielectric layer, the channel layer, and a channel filling insulating layer are sequentially stacked in the first region, and at least a portion of the gate dielectric layer is in the second region.

18. The semiconductor device of claim 16, wherein the channel structures have a first pitch, and the dummy channel structures have a second pitch equal to or greater than the first pitch.

* * * * *